(12) United States Patent
Cho et al.

(10) Patent No.: US 10,867,672 B2
(45) Date of Patent: Dec. 15, 2020

(54) RESISTIVE MEMORY DEVICE AND PROGRAMMING METHOD OF THE SAME

(71) Applicant: Samsung Electronics Co., Ltd., Suwon-si (KR)

(72) Inventors: Yong-Sung Cho, Hwaseong-si (KR); Moo-Sung Kim, Yongin-si (KR); Seung-You Baek, Suwon-si (KR); Jong-Min Baek, Hwaseong-si (KR); Bong-Kil Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/502,744

(22) Filed: Jul. 3, 2019

(65) Prior Publication Data

US 2020/0211646 A1 Jul. 2, 2020

(30) Foreign Application Priority Data

Dec. 31, 2018 (KR) ........................ 10-2018-0173853

(51) Int. Cl.
*G11C 13/00* (2006.01)

(52) U.S. Cl.
CPC ........ *G11C 13/0069* (2013.01); *G11C 13/003* (2013.01); *G11C 13/0004* (2013.01); *G11C 13/0038* (2013.01); *G11C 2013/0078* (2013.01)

(58) Field of Classification Search
CPC ............................ G11C 16/10; G11C 13/0069
USPC ............................................ 365/163, 185.24
See application file for complete search history.

(56) References Cited

U.S. PATENT DOCUMENTS

| | | | |
|---|---|---|---|
| 6,222,762 B1* | 4/2001 | Guterman | G11C 11/5621 |
| | | | 257/E27.103 |
| 7,656,710 B1* | 2/2010 | Wong | G11C 16/12 |
| | | | 365/185.19 |
| 7,773,409 B2 | 8/2010 | Chen et al. | |
| 8,111,545 B2 | 2/2012 | Lim et al. | |
| 8,289,762 B2 | 10/2012 | Kau et al. | |
| 8,605,531 B2 | 12/2013 | Kau | |
| 9,099,174 B2 | 8/2015 | Calderoni et al. | |
| 9,349,461 B1* | 5/2016 | Pan | G11C 16/10 |
| 9,627,055 B1 | 4/2017 | Robustelli | |
| 10,242,734 B1* | 3/2019 | Khakifirooz | G11C 16/3418 |
| 2011/0122683 A1 | 5/2011 | Dodge et al. | |
| 2012/0236653 A1* | 9/2012 | Spessot | G11C 16/3436 |
| | | | 365/185.19 |
| 2013/0201750 A1* | 8/2013 | Lee | G11C 13/0069 |
| | | | 365/148 |
| 2013/0223128 A1* | 8/2013 | Park | G11C 11/21 |
| | | | 365/148 |

(Continued)

*Primary Examiner* — Michael T Tran
(74) *Attorney, Agent, or Firm* — Harness, Dickey & Pierce, P.L.C.

(57) ABSTRACT

In some example embodiments, a program pulse is applied to a resistive memory cell and a plurality of post pulses are applied to the resistive memory cell at a time point after a relaxation time from a time point when application of the program pulse is finished, the plurality of post pulses having voltage levels that increase sequentially. Programming speed and/or performance of the resistive memory device may be enhanced by accelerating resistance drift of the resistive memory cell using the plurality of post pulses having the voltage levels that increase sequentially.

20 Claims, 22 Drawing Sheets

(56) References Cited

U.S. PATENT DOCUMENTS

| | | | |
|---|---|---|---|
| 2013/0301337 A1* | 11/2013 | Kamalanathan | G11C 13/003 365/148 |
| 2014/0047163 A1* | 2/2014 | Kwak | G11C 16/00 711/103 |
| 2014/0160831 A1* | 6/2014 | Lee | G11C 13/0002 365/148 |
| 2014/0204650 A1* | 7/2014 | Lee | G11C 13/0069 365/148 |
| 2014/0264050 A1* | 9/2014 | Rostaing | G01T 1/17 250/371 |
| 2015/0049545 A1* | 2/2015 | Jo | G11C 16/0483 365/185.03 |
| 2016/0027510 A1* | 1/2016 | Lee | G11C 13/0033 365/148 |
| 2016/0196876 A1* | 7/2016 | Lee | G11C 13/0069 365/63 |
| 2016/0260490 A1* | 9/2016 | Lee | H01L 27/11582 |
| 2017/0018306 A1* | 1/2017 | Lin | G11C 13/0097 |
| 2017/0162248 A1* | 6/2017 | Matsuoka | G11C 11/1655 |
| 2017/0271007 A1* | 9/2017 | Suzuki | G11C 13/0069 |
| 2017/0271012 A1* | 9/2017 | Park | G11C 16/0483 |
| 2018/0197602 A1* | 7/2018 | Lim | G11C 13/0069 |
| 2018/0204616 A1* | 7/2018 | Park | G11C 7/10 |
| 2018/0277208 A1* | 9/2018 | Kamalanathan | G11C 11/5664 |
| 2019/0057751 A1* | 2/2019 | Lee | G11C 16/08 |
| 2019/0103159 A1* | 4/2019 | Khakifirooz | G11C 11/5628 |
| 2019/0130982 A1* | 5/2019 | Reusswig | G11C 16/349 |
| 2019/0147962 A1* | 5/2019 | Chen | G11C 16/3427 365/185.17 |
| 2019/0172532 A1* | 6/2019 | Futase | G11C 13/0064 |
| 2019/0198104 A1* | 6/2019 | Luo | G11C 13/0023 |
| 2020/0082884 A1* | 3/2020 | Hanyu | G11C 11/1675 |
| 2020/0211611 A1* | 7/2020 | Hanyu | G11C 11/1675 |

* cited by examiner

RESISTIVE MEMORY DEVICE AND PROGRAMMING METHOD OF THE SAME

CROSS-REFERENCE TO RELATED APPLICATION

This U.S. non-provisional application claims priority under 35 USC § 119 to Korean Patent Application No. 10-2018-0173853, filed on Dec. 31, 2018, in the Korean Intellectual Property Office (KIPO), the disclosure of which is incorporated by reference herein in its entirety.

BACKGROUND

1. Technical Field

Some example embodiments relate generally to semiconductor integrated circuits, and more particularly resistive memory devices and/or programming methods of resistive memory devices.

2. Discussion of the Related Art

Semiconductor memory devices for storing data may be classified into volatile memory devices and non-volatile memory devices. The volatile memory devices, such as dynamic random access memory (DRAM) devices, are typically configured to store data by charging or discharging capacitors in memory cells, and lose the stored data when power is off. The non-volatile memory devices, such as flash memory devices, may maintain stored data even though power is off. According to demand for high memory capacity, high operation speed and low power consumption of the memory devices, resistive memories of various types have been developed in an attempt to combine the high integration rate and high speed of DRAM devices and the non-volatility of flash memory devices in a single memory device. Materials used in resistive memory devices have a resistance that is variable depending on magnitude and/or direction of applied voltage and/or current. Moreover, the resistance of the material can be maintained (that is, non-volatility) even though the applied voltage and/or current is removed and thus a refresh operation may not be required. However, the resistance of the programmed resistive memory cell may be drifted or shifted over time, which may degrade performance of the resistive memory devices.

SUMMARY

Some example embodiments may provide a programming method of a resistive memory device, capable of increasing an operation speed of the resistive memory device.

According to example embodiments, a programming method of a resistive memory device, includes, applying a program pulse to a resistive memory cell and applying a plurality of post pulses to the resistive memory cell at a time point after a relaxation time from a time point when application of the program pulse is finished, the plurality of post pulses having voltage levels that increase sequentially.

According to example embodiments, a programming method of a resistive memory device, includes, applying a reset program pulse to a resistive memory cell including a phase-change material, applying a first post pulse having a first voltage level to the resistive memory cell at a time point after a relaxation time from a time point when application of the reset program pulse is finished and applying a second post pulse having a second voltage level higher than the first voltage level to the resistive memory cell after the first post pulse is applied.

According to example embodiments, a resistive memory device includes a memory cell array including a plurality of resistive memory cells and a pulse generator configured to generate a program pulse and a plurality of post pulses having voltage levels that increase sequentially. The resistive memory device applies the program pulse to a selected memory cell among the plurality of resistive memory cells and applies the plurality of post pulses to the selected resistive memory cell at a time point after a relaxation time from a time point when application of the program pulse is finished.

The resistive memory device and the programming method according to example embodiments may enhance a programming speed and performance of the resistive memory device, for example, by accelerating resistance drift of the resistive memory cell using the plurality of post pulses having the voltage levels that increase sequentially.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
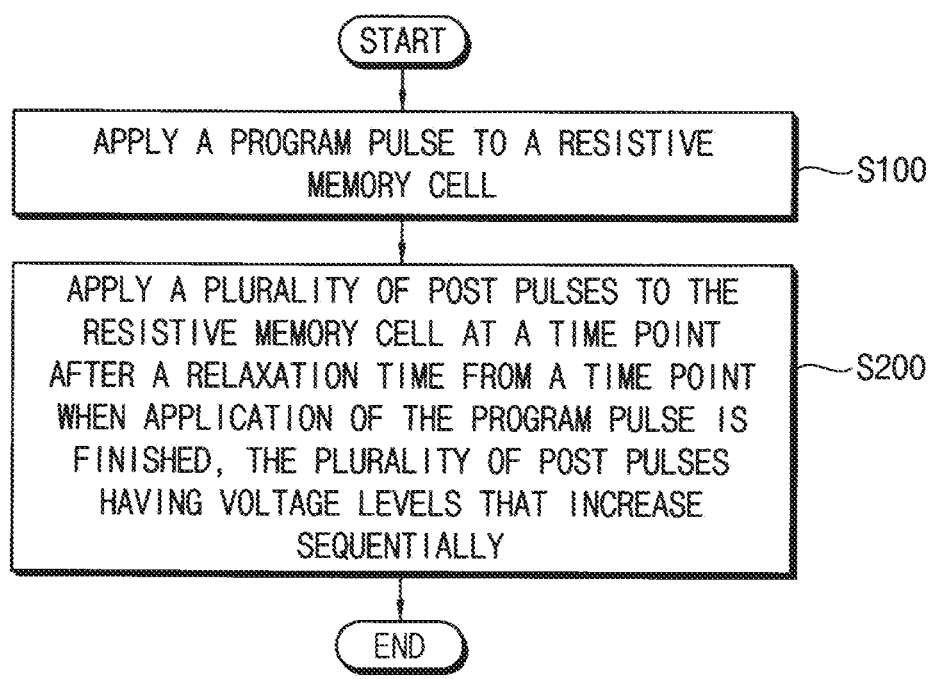
FIG. 1 is a flow chart illustrating a programming method of a resistive memory device according to some example embodiments.

Various example embodiments will be described more fully hereinafter with reference to the accompanying drawings, in which some example embodiments are shown. In the drawings, like numerals refer to like elements throughout. Descriptions of certain aspects of one drawing may be omitted from descriptions of other drawings.

Figure 2:
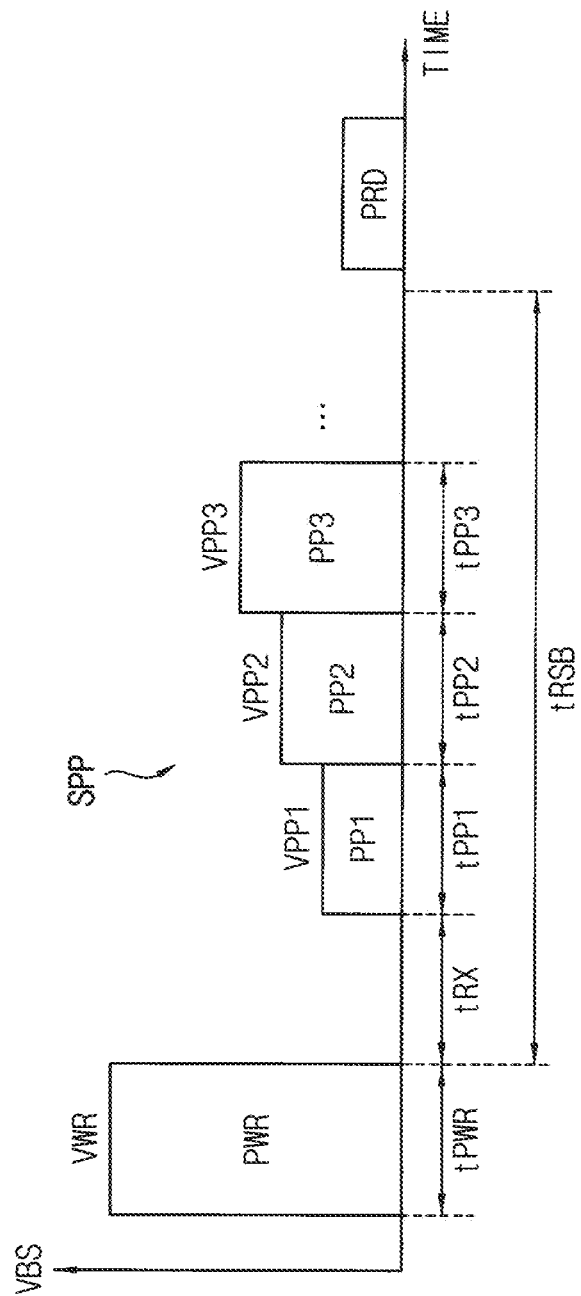
FIG. 2 is a timing diagram illustrating a programming method of a resistive memory device according to some example embodiments.

FIG. 1 is a flow chart illustrating a programming method of a resistive memory device according to example embodiments, and FIG. 2 is a timing diagram illustrating a programming method of a resistive memory device according to example embodiments. In FIG. 2, a horizontal axis indicates a time and a vertical axis indicates a bias voltage VBS applied over a resistive memory cell.

Referring to FIGS. 1 and 2, a program pulse PWR is applied to a resistive memory cell (S100) and a plurality of post pulses PP1, PP2 and PP3 having voltage levels VPP1, VPP2 and VPP3 that increase sequentially are applied to the resistive memory cell at a time point after a relaxation time tRX from a time point when application of the program pulse PWR is finished (S200). FIG. 2 illustrates a post pulse signal SPP including the three post pulses PP1, PP2 and PP3 for convenience of illustration and description, but example embodiments are not limited thereto. According to example embodiments, the post pulse signal SPP may include two, four or more post pulses. In some example embodiments, as will be shown for example in FIG. 13, programming of the resistive memory device may result in distinct resistance ranges representing a set state and resistance ranges representing a reset state, whereby a gap between the resistance ranges (the "read margin" MGRD) may enable the state of the resistive memory device to be determined. Further, as shown for example in FIG. 14, the resistance ranges of each state are produced by a resistance drift during programming, and the duration involved in achieving the resistance drift may serve as a basis for the duration of programming the resistive memory device. Further, as shown for example, in FIG. 15, a pulse may be selected with a voltage level that affects the rate of resistance drift, but also not to exceed a voltage limit VLIM; and, correspondingly, the voltage limit VLIM may increase after each post pulse. Some example embodiments may include applying a plurality of post pulses to the resistive memory cell after the program pulse, wherein the plurality of post pulses have voltage levels that increase sequentially, which may accelerate the resistance drift (without exceeding the voltage limit VLIM) and may thereby reduce the duration of programming the resistive memory device as presented herein.

Some examples in which a bias voltage VBS is applied over the resistive memory cell may be implemented variously as will be described below with reference to FIGS. 4 through 9.

In some example embodiments, the plurality of post pulses PP1, PP2 and PP3 having the sequentially increasing voltage levels VPP1, VPP2 and VPP3 may be implemented by sequentially increasing or sequentially decreasing a voltage applied to a bitline connected to one end of the resistive memory cell and/or a current through the bitline and/or resistive memory cell.

In some example embodiments, a plurality of post pulses PP1, PP2 and PP3 having the sequentially increasing voltage levels VPP1, VPP2 and VPP3 may be implemented by sequentially increasing or sequentially decreasing a voltage applied to a wordline connected to the other end of the resistive memory cell and/or a current through the wordline and/or resistive memory cell.

In still other example embodiments, the plurality of post pulses PP1, PP2 and PP3 having the sequentially increasing voltage levels VPP1, VPP2 and VPP3 may be implemented by sequentially increasing the voltage applied to one of the bitline and the wordline and simultaneously by sequentially decreasing the voltage applied to the other of the bitline and the wordline and/or a current through the bitline, wordline, and/or resistive memory cell.

The program pulse PWR may be a reset program pulse to program the resistive memory cell to a reset state or a set program pulse to program the resistive memory cell to a set state. The programming of the reset state and set state will be described below.

A program voltage level VWR and a program pulse width tPWR of the program pulse PWR may be controlled based on characteristics of the resistive memory cell and a target state to be programmed by the program pulse PWR.

The relaxation time tRX may be determined based on a cooling time for which the resistive memory cell is cooled to the reset state or the set state after the program pulse PWR is applied. The cooling time will be described below.

The post pulse signal SPP including the plurality of post pulses PP1, PP2 and PP3 may be generated by a pulse generator, which may be a voltage generator and/or a current generator, as will be described below with reference to FIG. 3. The plurality of post pulses PP1, PP2 and PP3 may accelerate resistance drift as will be described below.

To accelerate the resistance drift of the resistive memory cell, the voltage levels VPP1, VPP2 and VPP3 and the pulse widths tPP1, tPP2 and tPP3 of the plurality of post pulses PP1, PP2 and PP3 may be controlled. Example embodiments of such control method will be described with reference to FIGS. 16 through 27.

In general, a read standby time tRSB is required to determine the programmed state of the resistive memory cell due to the resistance drift of the resistive memory cell. The programmed state may be read out or determined by applying a read pulse PRD after the read standby time tRSB is elapsed. The resistance drift of the resistive memory cell progresses slowly and it is a major factor of performance degradation of the resistive memory device.

The entire time of programming the resistive memory cell may be reduced using the plurality of post pulses PP1, PP2 and PP3 included in the post pulse signal SPP and a time point of enabling a read operation after the programming operation may be advanced by reducing the read standby time tRSB.

As such, the resistive memory device and the programming method according to example embodiments may enhance a programming speed and performance of the resistive memory device by accelerating the resistance drift of the resistive memory cell using the plurality of post pulses having the voltage levels that increase sequentially.

Figure 3:
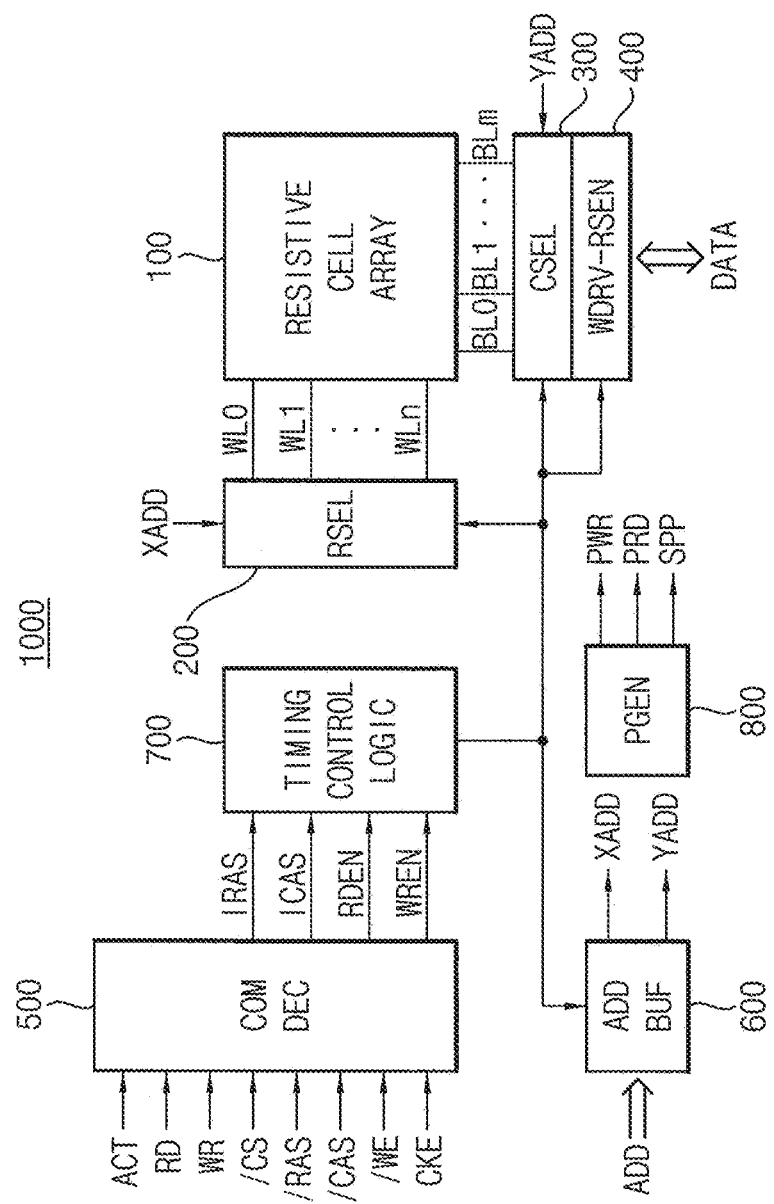
FIG. 3 is a block diagram illustrating a resistive memory device according to some example embodiments.

FIG. 3 is a block diagram illustrating a resistive memory device according to example embodiments. Referring to FIG. 3, a resistive memory device 1000 may include a resistive cell array 100, a row selection circuit (RSEL) 200, a column selection circuit (CSEL) 300, an input-output circuit 400, a command decoder (COM DEC) 500, an address buffer (ADD BUF) 600, a timing control logic 700, and a pulse generator PGEN 800. The input-output circuit 400 may include a write driver WDRV and a read sensing circuit RSEN. The resistive cell array 100 includes a plurality of resistive memory cells respectively coupled to a plurality of wordlines WL0 through WLn and a plurality of bitlines BL0 through BLm. The resistive memory cell may have relatively a lower resistance value or a higher resistance value depending on the written data. The embodiments of the resistive memory cell are described with reference to FIGS. 4 through 11.

As further shown in FIG. 3, the command decoder 500 may be configured to generate internal command signals such as an internal RAS signal IRAS, an internal CAS signal ICAS, an internal read enable signal RDEN, an internal write enable signal WREN, and the like based on the control signals /CS, /RAS, /CAS, /WE and CKE from a memory controller and other signals such as an active command ACT, a read command RD, and/or a write command WR. The internal RAS signal IRAS may be activated at a time point when the active command ACT is received, and the internal CAS signal ICAS may be activated at a time point when the read command RD or the write command WR is received. The internal read enable signal RDEN may be activated at a time point when the read command RD is received, and the internal write enable signal WREN may be activated at a time point when the write command WR is received.

In some example embodiments, control signals and/or internal command signals may correspond to an example operation of the resistive memory device 1000, and example embodiments are not limited thereto. For example, the control signals and the internal command signals may be implemented variously according to a configuration of the resistive memory device 1000.

Some example embodiments may include a timing control logic 700 that is configured to generate timing control signals based on the internal command signals IRAS, ICAS, RDEN and WREN to control operation timings of the resistive memory device 1000.

Some example embodiments may include an address buffer 600 that is configured to generate a row address signal XADD and a column address signal YADD based on an external address ADD transferred from the memory controller 1100. The row address signal XADD may be provided to the row selection circuit 200 and the column address signal YADD may be provided to the column selection circuit 300.

Some example embodiments may include a the row selection circuit 200 that is configured to select a wordline corresponding to the row address signal XADD among the wordlines WL0 through WLn in response to the timing control signals from the timing control logic 700. The column selection circuit 300 may be configured to select a bitline corresponding to the column address signal YADD among the bitlines BL0 through BLm in response to the timing control signals from the timing control logic 700.

Some example embodiments may include a write driver WDRV and/or a read sensing circuit RSEN, which may be coupled to the bitlines BL0 through BLm. According to some example embodiments, the write driver WDRV and the read sensing circuit RSEN may be coupled to the bitlines BL0 through BLm directly or via the column selection circuit 300.

Some example embodiments may include a read sensing circuit RSEN that is configured to sense the data stored in the resistive memory cells to provide the read data. The write driver WDRV may be configured to program the write data in the resistive memory cells. The write driver WDRV may be formed integrally with the read sensing circuit RSEN, and/or the write driver WDRV may be formed as a circuit distinct from the read sensing circuit RSEN.

Some example embodiments may include a voltage generator VGEN that is configured to generate a program pulse PWR, a read pulse PRD, and/or a post pulse signal SPP. In some example embodiments, voltage levels and timings of the voltage generator VGEN may be controlled in response to the timing control signals from the timing control logic 700. The program pulse may include a reset program pulse to program the resistive memory cell to a reset state and a set program pulse to program the resistive memory cell to a set state.

In some example embodiments and as described with reference to FIGS. 1 and 2, the post pulse signal SPP includes a plurality of post pulses PP1, PP2 and PP3 having sequentially increasing voltage levels VPP1, VPP2, and VPP3 that are applied to the resistive memory cell at a time point after a relaxation time tRX from a time point when application of the program pulse PWR is finished. Using the plurality of post pulses PP1, PP2 and PP3, the resistance drift of the resistive memory cell may be accelerated.

Figure 4:
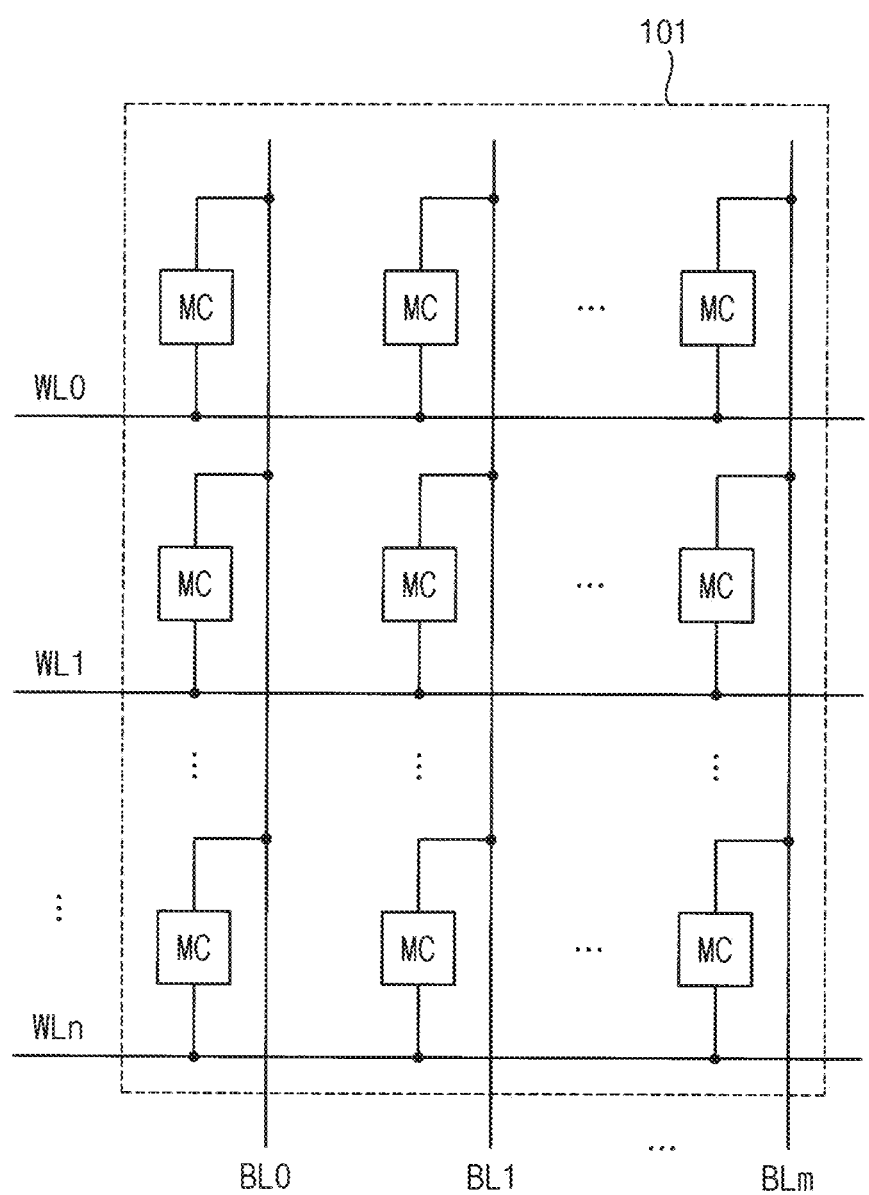
FIG. 4 is a diagram illustrating an example embodiment of a resistive cell array included in a resistive memory device of FIG. 3.

FIG. 4 is a diagram illustrating an example embodiment of a resistive cell array included in a resistive memory device of FIG. 3.

Referring to FIGS. 3 and 4, a memory cell array 101 includes a plurality of memory cells MC, which are disposed at the positions crossed by wordlines WL0~WLn and bitlines BL0~BLm. Each memory cell MC may include a resistive element as will be described below with reference to FIGS. 5 and 6. When the corresponding wordline is selected and enabled by the row selection circuit 200, the program operation or the read operation may be performed with respect to the resistive memory cells connected to the selected wordline. The row selection circuit 200 may include a row decoder for decoding the row address signal XADD and a wordline driver circuit for applying the program pulse PWR, the read pulse PRD or the post pulse signal SPP to the selected wordline, in response to the outputs of the row decoder. Each memory cell MC is coupled between one of the wordlines WL0~WLn and one of the bitlines BL0~BLm. In this case, the bias voltage applied over each memory cell MC may be a voltage difference between the voltages applied to the bitline and the wordline.

In some example embodiments, the memory cell MC may be implemented with a phase-change random access memory (PRAM) cell using phase-change materials, a resistance random access memory (RRAM) cell using complex metal oxide of variable resistance, a ferroelectrics random access memory (FRAM) cell using ferroelectric materials and a magneto-resistive random access memory (MRAM) cell using ferromagnetic materials. Such resistive materials of the resistive element may have the resistance value depending on the magnitude and/or the direction of the applied current or voltage and have characteristics of non-volatility of maintaining the resistance value even though power is off.

In some example embodiments, the bitlines BL0~BLm may be coupled to a write driver WDRV. The write driver WDRV may be enabled in response to the reception of the write command WR and/or may perform a write operation by applying a current or voltage to the memory cell MC via the corresponding bitline.

In some example embodiments, the column selection circuit 300 may include a column gating circuit and a column decoder for selecting the bitline corresponding to the column address signal YADD. The column decoder generates column select signals to select one of the bitlines BL0~BLm in response to the column address signal YADD and a column selection enable signal. The column selection enable signal may be provided from the timing control logic 700 in FIG. 3. The column gating circuit may include a plurality of switches coupled to the bitlines BL0~BLm. The switches are turned on selectively in response to the column select signals. The switch corresponding to the column address signal YADD is turned on to select the bitline and a data voltage or a data current related with the resistance value of the memory cell MC is transferred to the read sensing circuit through the selected bitline.

In some example embodiments, the read sensing circuit may be coupled to the bitlines BL0~BLm via the column selection circuit 300 and sense the data stored in the memory cell MC to provide the read data.

Figure 5:
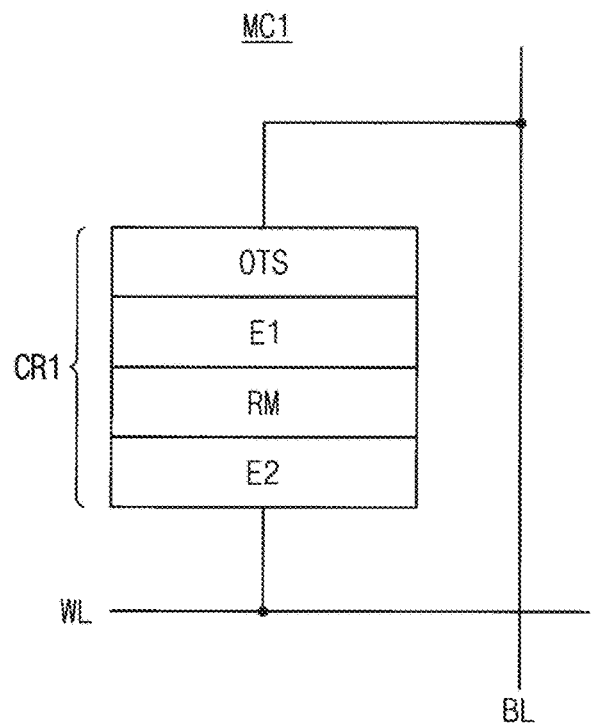
FIGS. 5 and 6 are diagrams illustrating example embodiments of a resistive memory cell included in the resistive cell array of FIG. 4.
Figure 6:
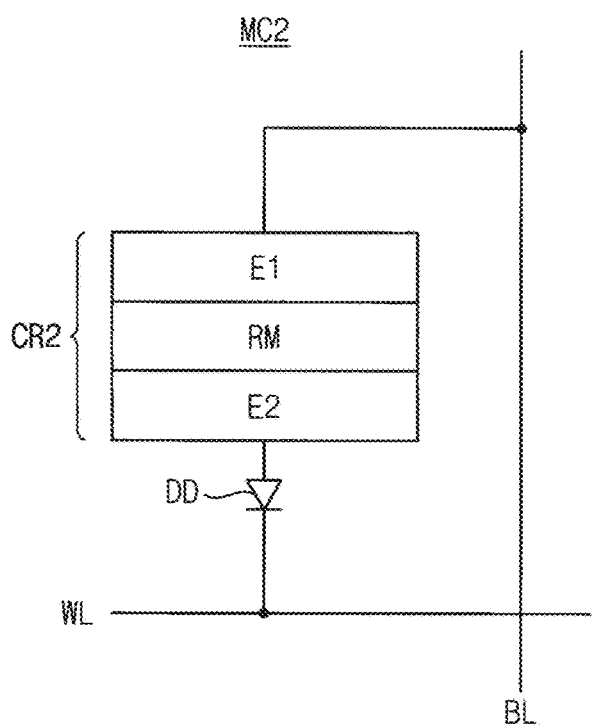

FIGS. 5 and 6 are diagrams illustrating example embodiments of a resistive memory cell included in the resistive cell array of FIG. 4. Referring to FIG. 5, a resistive memory cell MC1 may include a resistive element CR1 connected between a wordline WL and a bitline BL. The ends of the resistive element CR1 are respectively coupled to the wordline WL and the bitline BL to selectively enable writing data to and/or reading data from the resistive memory cell MC1.

In some example embodiments, a resistive element CR1 may include an ovonic threshold switch (OTS) that selectively isolates the resistive memory cell MC1 from conducting current; a first electrode E1; a resistive material RM to maintain a state representing a particular stored data value; and/or a second electrode E2. In some example embodiments, the resistive element CR1 may be formed by a series of layers between the wordline WL and the bitline BL or in other geometric relationships. The resistive material or the phase change material RM may be a material having electrical properties such as resistance, capacitance, or other electrical characteristics, that may be changed through the application of energy such as, for example, heat, light, voltage potential, or electrical current. A large variety of phase change material types with widely differing properties may be selected for the resistive material RM. In some example embodiments, the resistive material RM may include a chalcogenide material.

In some example embodiments, a resistive material RM may remain stable locally in one of two phases or in a combination of the two phases over an operating temperature range. The resistive material RM may exhibit different electrical properties in the amorphous phase than in the crystalline phase. In various example embodiments, the resistive material RM may include either or both of two properties: (a) it may exist locally in an amorphous phase without crystallization for a prolonged period of time, such as for several years, at room temperature, and/or (b) the amorphous phase may crystallize rapidly if temperature is raised.

In some example embodiments, characteristics of the resistive material RM may depend on the type of material and/or the phases of the material that are used. In some example embodiments, the resistive material RM may be put into a high resistance state or a low resistance state. In some example embodiments, the high resistance state may be referred to as the reset state and the low resistance state may be referred to as the set state; in other example embodiments, the terminology may be reversed. In some example embodiments, the high resistance state may be created by putting the resistive material RM into a predominately amorphous phase and the low resistance state may be created by putting at least a portion of the resistive material RM into a crystalline phase. In some example embodiments, more than two logical states may be created by using various combinations of the phases to create different resistance ranges.

In some example embodiments, rather than resistance states of the resistive material RM being characterized by a pure resistance, resistance states may instead be characterized by a change in a threshold voltage where a significant amount of current begins to flow and/or by a change in a threshold current where a voltage is applied over the resistive material RM. For example, a state with a low threshold voltage and/or threshold current may be referred to as the low resistance state, and the state with a higher threshold voltage and/or threshold current may be referred to as the high resistance state. As used herein, referring to changing the resistance may actually mean that the threshold voltage and/or current changes, and references to a low or high resistance state may actually mean a low or high voltage relative to a threshold voltage and/or a low or high current relative to a threshold current.

In some example embodiments, a resistive material RM may include a chalcogenide material or an ovonic material. An ovonic material may be a material that undergoes electronic or structural changes and acts as a semiconductor if subjected to application of a voltage potential, an electrical current, light, heat, and the like. An ovonic material may be used in a memory element or in an electronic switch. A chalcogenide material may be a material that includes at least one element from Group VI A of the periodic table, such as sulfur (S), selenium (Se), and/or tellurium (Te), although some example embodiments are not limited thereto. Phase change materials may also include elements from other groups of the periodic table, such as Group III A (gallium (Ga) and indium (In)), Group IV A (silicon (Si), germanium (Ge), and tin (Sn)), Group V A (phosphorus (P), arsenic (As), antimony (Sb), and bismuth (Bi)), Group I B (silver (Ag) and gold (Au)), and/or Group VIII B (cobalt (Co) and palladium (Pd)), although some example embodiments are not limited thereto. Phase change state material 206 may be a chalcogenide element composition of the class of tellurium-germanium-antimony ($Te_xGe_ySb_z$) material or a GeSbTe alloy, although some example embodiments are not limited thereto.

In some example embodiments, a resistive material RM may be programmed into one of at least two memory states by applying an electrical signal to the resistive material RM to alter the phase of at least some of the resistive material RM between a crystalline phase and an amorphous phase. In some example embodiments, an electrical current may flow through at least a portion of the resistive material RM in response to the bias voltage applied to at least one of the first electrode E1 and the second electrode E2, thereby heating and then cooling the resistive material RM to alter the resistance of the resistive material RM. Various resistances of the resistive material RM may be achieved to store information by varying the amount of current flow and duration through the volume of the resistive material RM.

In some example embodiments, a reset program operation may include a reset program pulse having a higher voltage and/or current level and/or a shorter program pulse width may be applied to the resistive memory cell. The temperature of the resistive material RM exceeds the melting temperature of the resistive material RM by a reset current flowing through the resistive material RM and the resistive material RM is melted. If the resistive material RM is allowed to cool quickly, the resistive material RM may be in a reset state corresponding to a high resistance state, for example, due to the formation of a crystalline structure that is less regular than the formation of the crystalline structure in a low resistance state.

In some example embodiments, a set program operation may include a set program pulse having a lower voltage and/or current level and a longer program pulse width may be applied to the resistive memory cell. The temperature of the resistive material RM increases to be higher than a crystallization temperature and lower than a melting temperature by a set current flowing through the resistive material RM. After that, the resistive material RM is allowed to cool slowly, and the resistive material RM may be in a set state corresponding to a low resistance state, for example, due to the formation of a crystalline structure that is more regular than the formation of the crystalline structure in a high resistance state.

In some example embodiments, information stored in the resistive memory cell MC may be read by checking a threshold voltage of the resistive memory cell MC. In an example embodiment, in a read operation, a read pulse may be applied to the resistive memory cell MC; a current through the resistive memory cell MC may be determined, for example, using the read sensing circuit RSEN in FIG. 3; and the state of the resistive memory cell MC may be determined based on the induced current flowing through the resistive memory cell MC and a threshold current. In another example embodiment, in a read operation, current may be induced to flow through the resistive memory cell MC in a pulsed manner; a voltage over the resistive memory cell MC may be determined; and the state of the resistive memory cell MC may be determined based on the voltage and a threshold voltage.

In some example embodiments, the set state and reset state may be determined according to a voltage level and/or current level of the read pulse. For example, if the voltage level of the read pulse is higher than the threshold voltage of the resistive memory cell MC, the current flowing through the resistive memory cell MC may be higher than the threshold current, which indicates that the resistive material RM is in the set state. In contrast, if the voltage level of the read pulse is lower than the threshold voltage of the resistive memory cell MC, the current flowing through the resistive memory cell MC may be lower than the threshold current, which indicates that the resistive material RM is in the reset state.

In some example embodiments, an OTS may be used to access the resistive material RM during programming or reading of the resistive material RM. The OTS may include an ovonic material to operate as a switch that is either off or on depending on a voltage applied across the ovonic material. The off state may be a substantially electrically non-conductive state and the on state may be a substantially conductive state. In some example embodiments, the off state may correspond to a reset state of the memory cell MC and the on state may correspond to a set state of the memory cell MC (or vice versa).

In some example embodiments, an OTS may utilize a chalcogenide material and/or an ovonic material, and may be referred to as an ovonic threshold switch, or simply an ovonic switch. The switching material of the OTS may be a material in a substantially amorphous state positioned between two electrodes that may be repeatedly and reversibly switched between a higher resistance off state and a relatively lower resistance on state. For example, the switching material of the OTS may remain persistently, including permanently, amorphous and the I-V characteristic may remain the same or similar throughout the operating life.

Referring to FIG. 6, a resistive memory cell MC2 may include a resistive element CR2 and a diode DD connected in series between a wordline WL and a bitline BL. The resistive memory cell MC2 of FIG. 6 is substantially the same as the resistive memory cell MC1 of FIG. 5, except that the OTS for the switching operation is replaced with the diode DD, and repeated descriptions are omitted.

Figure 7:
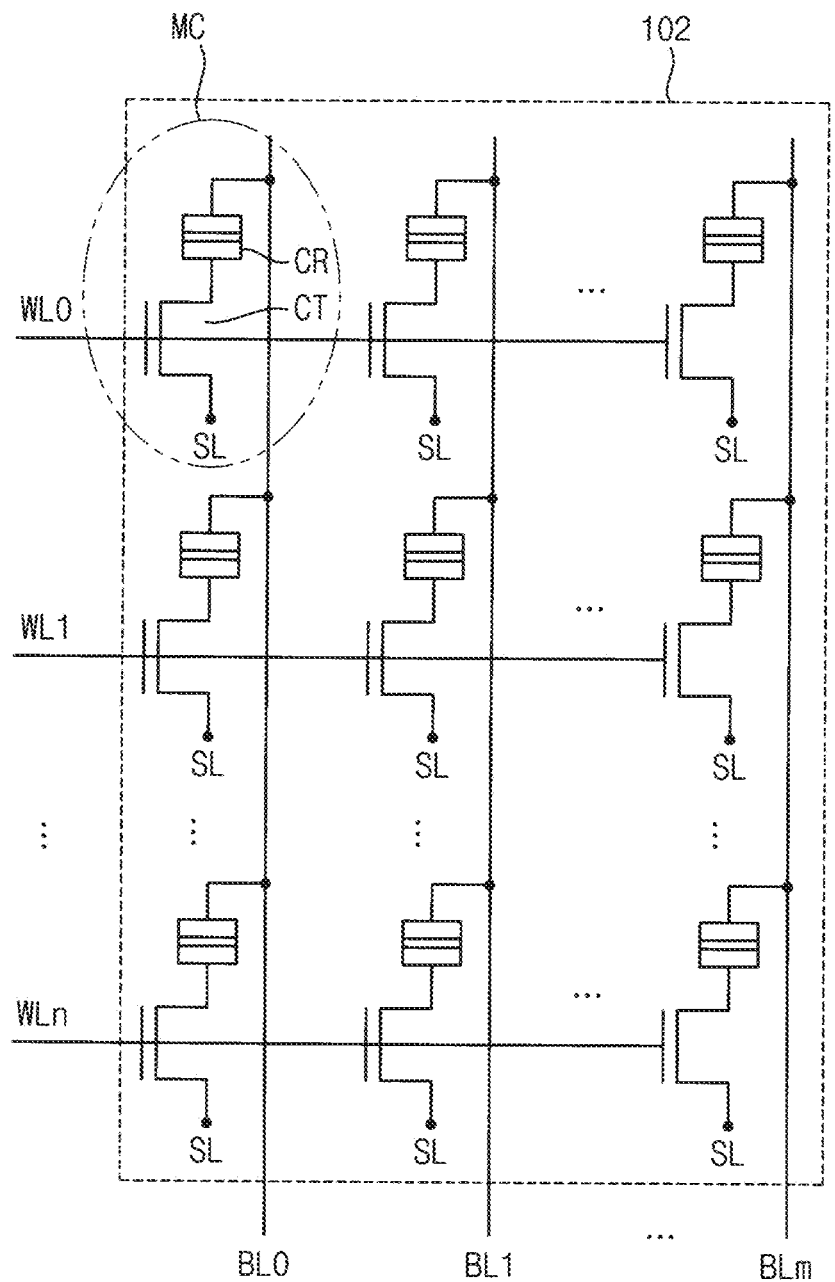
FIG. 7 is a diagram illustrating an example embodiment of a resistive cell array included in a resistive memory device of FIG. 3.

FIG. 7 is a diagram illustrating an example embodiment of a resistive cell array included in a resistive memory device of FIG. 3. Hereinafter, descriptions repeated with FIGS. 3 through 6 are omitted.

Referring to FIGS. 3 and 7, a memory cell array 102 includes a plurality of memory cells MC, which are disposed at the positions crossed by wordlines WL0~WLn and bitlines BL0~BLm. Each memory cell MC may include a cell transistor CT and a resistive element as will be described below with reference to FIGS. 8 and 9. When the corresponding wordline is selected and enabled by the row selection circuit 200, the cell transistor CT is turned on. Each memory cell MC is coupled between a source line SL and one of the bitlines BL0~BLm. In this case, the bias voltage applied over each memory cell MC may be a voltage difference between the voltages applied to the bitline and the source line. The plurality of memory cells MC may be coupled to the common source line SL. In some example embodiments, the memory cell array 102 may be partitioned into at least two cell regions and the cell regions may be coupled to the different source lines.

Figure 8:
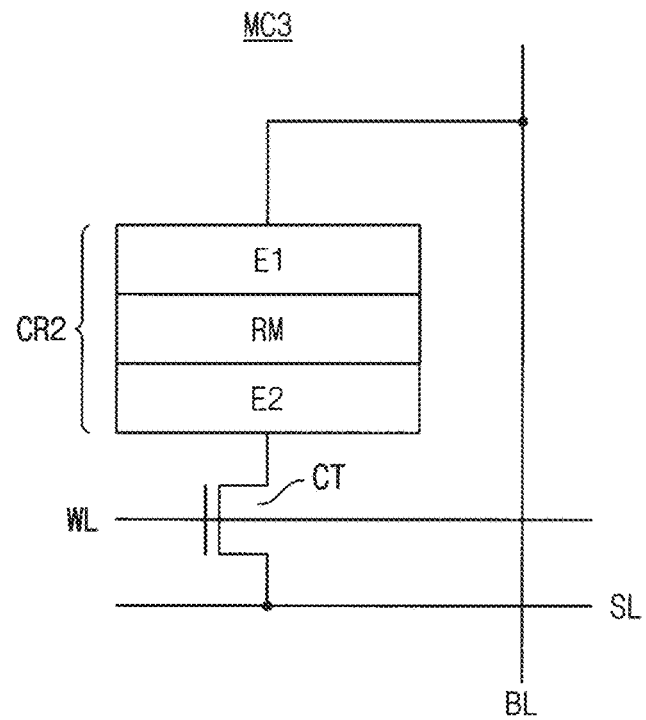
FIGS. 8 and 9 are diagrams illustrating example embodiments of a resistive memory cell included in the resistive cell array of FIG. 7.
Figure 9:
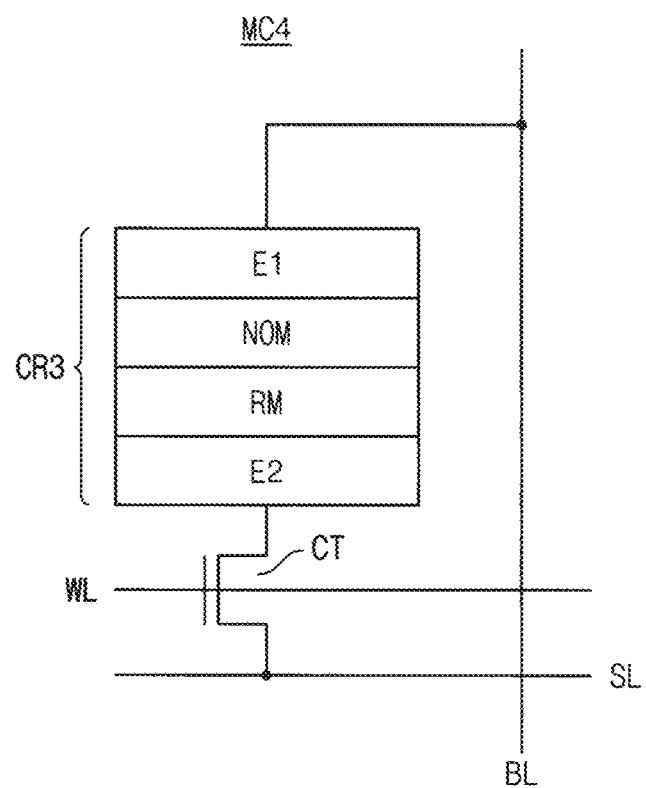

FIGS. 8 and 9 are diagrams illustrating example embodiments of a resistive memory cell included in the resistive cell array of FIG. 7.

Referring to FIG. 8, a resistive memory cell MC3 may include a resistive material RM2 and a cell transistor CT connected between a bitline BL and a source line SL. The cell transistor CT is selectively turned on in response to a voltage applied to the wordline WL. If the cell transistor CT is turned on, a bias voltage corresponding to a voltage difference between the bitline BL and the source line SL may be applied to the resistive material RM2. The resistive element CR1 of FIG. 8 is substantially the same as that of FIG. 6, and repeated descriptions are omitted.

Referring to FIG. 9, a resistive memory cell MC4 may include a resistive material RM3 and a cell transistor CT connected between a bitline BL and a source line SL. The cell transistor CT is selectively turned on in response to a voltage applied to the wordline WL. If the cell transistor CT is turned on, a bias voltage corresponding to a voltage difference between the bitline BL and the source line SL may be applied to the resistive material RM3. The resistive element CR3 may include a first electrode E1, a second electrode E2, a non-ohmic material (NOM), and resistive material (RM) between the electrodes E1 and E2. In this case, the set state and the reset state may be programmed or written by applying opposite voltages to the electrodes E1 and E2 and/or based on a direction of induced current through the electrodes E1 and E2. In other words, the set state and the reset state may be determined according to polarity of the applied voltage and/or a direction of an induced current.

Figure 10:
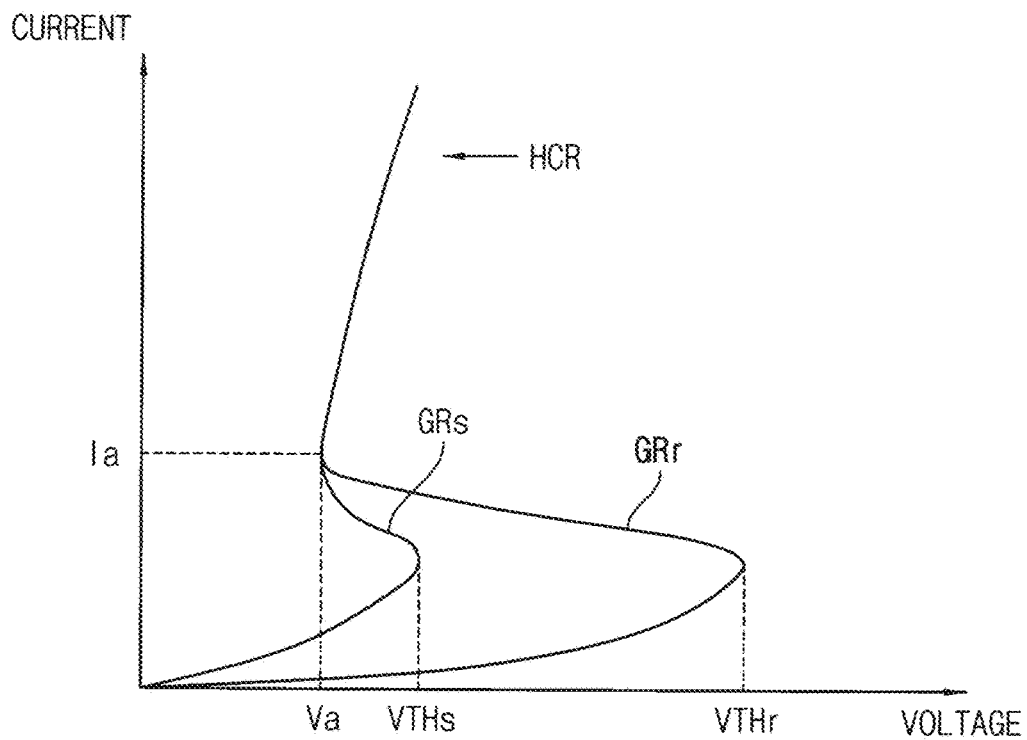
FIG. 10 is a diagram illustrating a relation between a current and a voltage of a resistive memory cell.

FIG. 10 is a diagram illustrating an example of a relation between a current and a voltage of a resistive memory cell. The curve GRs indicates a cell current with respect to a bias voltage applied over a resistive memory cell MC when a resistive material in the resistive memory cell is in a set state in an example embodiment, and a curve GRr indicates a cell current with respect to the bias voltage applied over the resistive memory cell MC when the resistive material in the resistive memory cell is in a reset state in some example embodiments.

In the example of FIG. 10, a set threshold voltage VTHs of the set state corresponds to an inflection point in curve GRs, where the resistive memory cell MC in the set state begins to exhibit changes in the cell current with a magnitude that is greater than the magnitude of changes in the threshold current, Ia, for small changes in cell voltage. For example, in a low voltage or low electric field mode where the bias voltage applied across the resistive memory cell MC is less than the set threshold voltage VTHs, the resistive memory cell MC may be in an off state that exhibits lower conductivity and/or higher resistance than in an on state. The resistive memory cell MC may remain effectively nonconductive until a voltage at least equal to about the set threshold voltage VTHs is applied that may switch the resistive memory cell MC to an on state that exhibits higher conductivity and/or lower resistance than in an off state. If the bias voltage greater than about the set threshold voltage VTHs is applied across resistive memory cell MC, the current carried by the resistive memory cell MC may change with a greater magnitude than a magnitude of changes in the applied bias voltage. as can be seen in the highly conductive region HCR of the curve GRs in FIG. 10. Similarly, a reset threshold voltage VTHr may correspond to an inflection point in the curve GRr where the resistive memory cell MC in the reset state begins to exhibit very large changes in the cell current, greater than the threshold current Ia, for small changes in the cell voltage. If the bias voltage of at least about the reset threshold voltage VTHr is applied across the resistive memory cell, the current carried by the resistive memory cell MC may change with a greater magnitude than a magnitude of changes in the bias voltage, as apparent in the highly conductive region HCR of the curve GRr in FIG. 10.

In some example embodiments, properties such as depicted in FIG. 10 may be utilized to determine a state of a resistive memory cell MC1. For example, a read pulse having a voltage level between the set threshold voltage VTHs and the reset threshold voltage VTHr may be applied to the resistive memory cell MC to determine the state of the resistive memory cell MC. The set state or the reset state of the resistive memory cell MC may be determined based on the current flowing through the resistive memory cell by the read pulse. Alternatively, a current may be induced to flow between the electrodes of the resistive memory cell MC and the state of the resistive memory cell MC may be determined based on a resulting voltage level over the memory cell MC.

Figure 11:
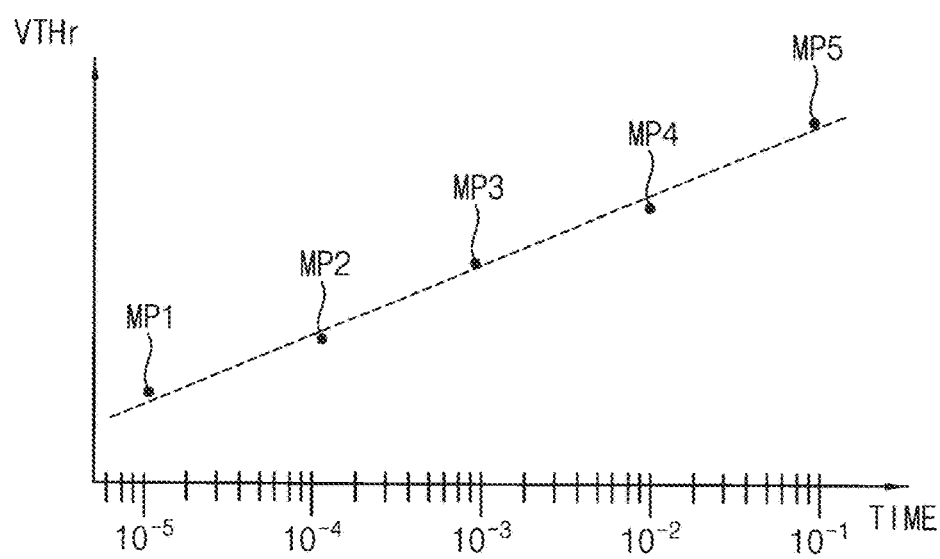
FIG. 11 is a diagram illustrating resistance drift of a resistive memory cell over time.

FIG. 11 is a diagram illustrating resistance drift of a resistive memory cell over time, including a logarithmic relationship of a reset threshold voltage VTHr to time for the resistive memory cell MC. In some example embodiments, the relationship may be vary with respect to the relationships shown in FIG. 11 based on the characteristics of the resistive memory cell MC. In some example embodiments, due to structural relaxation in the ovonic or other phase change state material of the resistive memory cell, the reset threshold voltage VTHr may increase over time. Such increasing is referred to herein as threshold voltage drift or resistance drift.

The graph of FIG. 11 shows a conceptual representation of a drift of the reset threshold voltage VTHr based on several discrete data points MP1~MP5, which may be determined, for example, through simulation, measurements of a plurality of resistive memory cells. The threshold voltage drift in FIG. 11 shows a change in a reset threshold voltage VTHr over a time domain that is represented using a logarithmic time scale. The time domain that may be tested to accumulate the discrete data points MP1~MP5 may be limited due to constraints on the amount of time allowable for testing, but due to the physics of the phase change state material, the slope of the threshold voltage drift may remain relatively constant even for times before and after the time domain used to acquire the discrete data points MP1~MP5.

In some example embodiments, the change in the threshold voltage of the resistive memory cell may vary substantively linearly with a logarithm of time. Therefore, it may be possible to predict a value of the threshold voltage at a particular time after the resistive memory cell has been programmed by calculating a drift rate of the threshold voltage. In some example embodiments, a drift rate of the threshold voltage may be determined by design testing of performance of a resistive memory device.

In some example embodiments, a set threshold voltage VTHs may exhibit a threshold voltage drift at a different rate than a threshold voltage drift of a reset threshold voltage VTHr. For example, the resistive memory cell may exhibit electrical characteristics that drift over time, such as the resistance of the resistive memory cell. As long as the drift is monotonic, repeatable, and predictable for the interested time duration, the exact characteristics of the drift may not be important and the material may be suitable for some applications. Once the drift rate has been determined, the drift rate may be used to predict a threshold voltage at a time point in the future.

Figure 12:
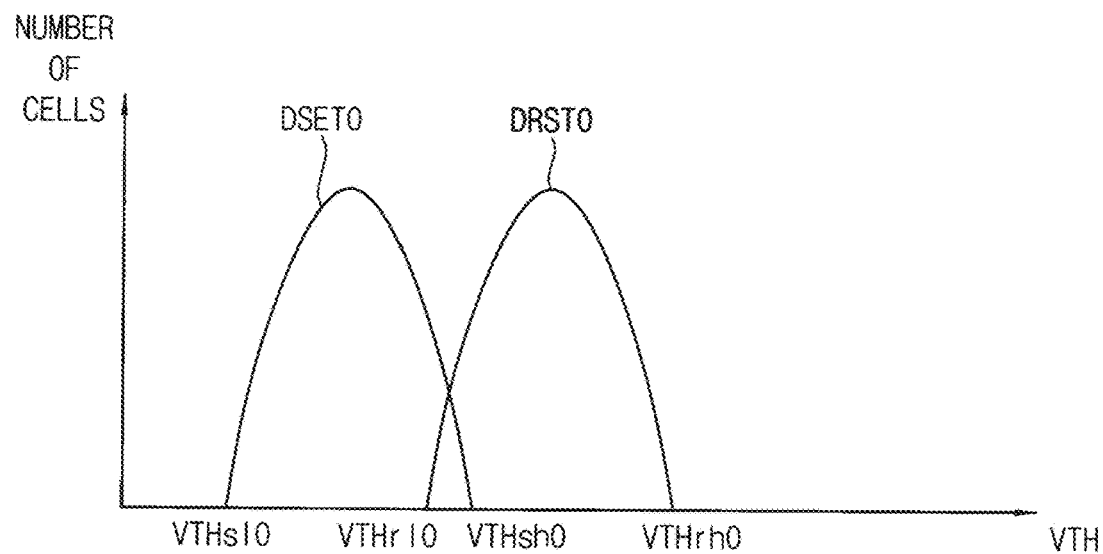
FIGS. 12 and 13 are diagrams describing for resistance drift of a resistive memory cell.
Figure 13:
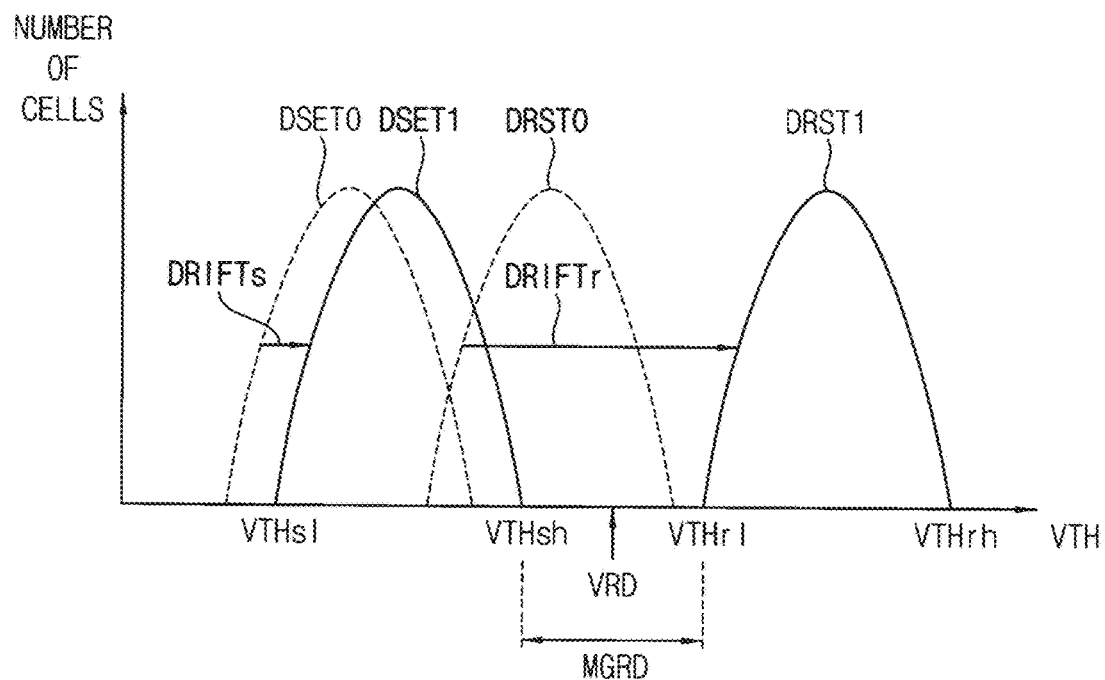

FIGS. 12 and 13 are diagrams describing for resistance drift of a resistive memory cell MC.

Referring to FIG. 12, a first distribution DSET0 represents an illustrative group of a threshold voltage of resistive memory cells MC if the resistive memory cells MC are in a set state. Similarly, a second distribution DRST0 represents an illustrative group of the threshold voltage if the resistive memory cells MC are in a reset state. The first distribution DSET0 and the second distribution DRST0 may be characterized by one or more parameters including, but not limited to, any of a variety of combinations of one or more statistical measures such as distribution mean, median, standard deviation, and the like. As illustrated in FIG. 12, the first distribution DSET0 may have a range of a first lower limit VTHsl0 and a first upper limit VTHsh0, and the second distribution DRST0 may have a range of a second lower limit VTHrl0 and a second upper limit VTHrh0. FIG. 12 illustrates a cast that the first distribution DSET0 and the second distribution DRST0 are superimposed partially, but some example embodiments may not be limited thereto.

FIG. 13 illustrates a third distribution DSET1 and a fourth distribution DRST1 after resistance drifts DRIFTs and DRIFTr are progressed from the first and second distributions DSET0 and DRST0, respectively. In some example embodiments and as illustrated in FIG. 13, a drift rate of a reset state may be higher than a drift rate of a set state. As a result, as illustrated in FIG. 13, the third distribution DSET1 may have a range of a third lower limit VTHs1 and a third upper limit VTHsh, and the fourth distribution DRST1 may have a range of a fourth lower limit VTHrl and a fourth upper limit VTHrh. Following a sufficient drift time, a read margin MGRD may result from the resistance drifts DRIFTs and DRIFTr. The set state or the reset state of the resistive memory cell may be determined using a read voltage revel VRD corresponding to an average value of the third upper limit VTHsh and the fourth lower limit VTHrl.

As further shown in FIG. 13, a read margin MGRD following application of a program pulse may be increased as the resistance drift DRIFTs of the set state is slowed and/or the resistance drift DRIFTr of the reset state is accelerated. Accordingly, the plurality of post pulses may be applied to the resistive memory cell MC only when the program pulse is a reset program pulse to program the resistive memory cell MC to a reset state, and the plurality of post pulses may not be applied to the resistive memory cell MC when the program pulse is a set program pulse to program the resistive memory cell MC to a set state, thereby increasing the read margin MGRD.

Figure 14:
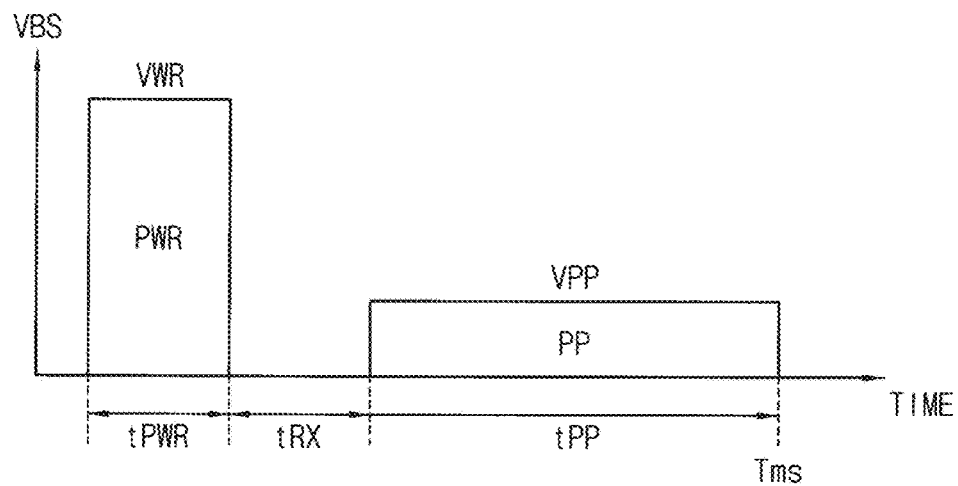
FIGS. 14 and 15 are diagrams illustrating a relation between a voltage level of a post pulse applied to a resistive memory cell and a threshold voltage of the resistive memory cell.
Figure 15:
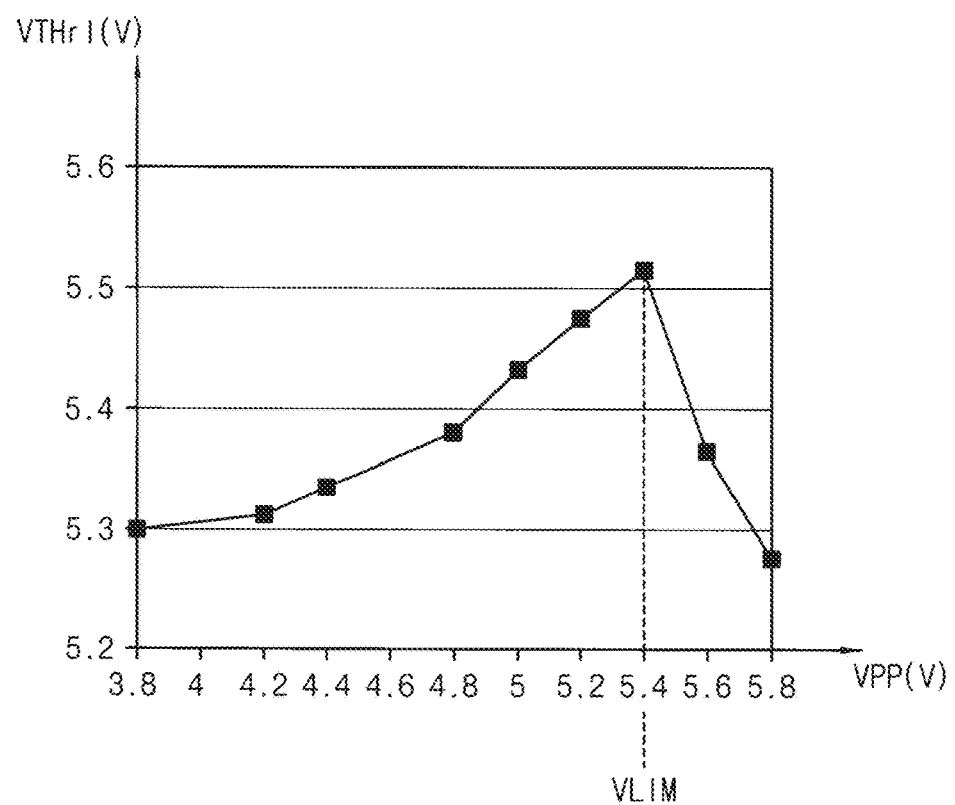

FIGS. 14 and 15 are diagrams illustrating a relation between a voltage level of a post pulse applied to a resistive memory cell and a threshold voltage of the resistive memory cell MC in some example embodiments.

FIGS. 14 and 15 illustrate examples of using a post pulse to accelerate a resistance drift, such as described above with reference to FIGS. 12 and 13. As illustrated in FIG. 14, a program pulse PWR having a program voltage level VWR and a program pulse width tPWR may be applied to a resistive memory cell MC, and a post pulse PP having a voltage level VPP and a pulse width tPP may be applied to the resistive memory cell MC at a time point after a relaxation time tRX from a time point when application of the program pulse PWR is finished.

FIG. 15 illustrates an example of a relationship between the voltage level VPP of a post pulse PP and a lower limit VTHrl of a reset threshold voltage of a reset state, which are measured at a measuring time point Tms in FIG. 14. The voltage level VPP and the lower limit VTHrl are represented by units of volts (V) in FIG. 15, for example cases.

As illustrated in FIG. 15, the lower limit VTHrl of the reset threshold voltage increases with the voltage level VPP of the post pulse PP, but the lower limit VTHrl decreases when the voltage level VPP of the post pulse PP exceeds a limit voltage VLIM. The resistance drift may be further accelerated as the voltage level VPP of the post pulse PP is increased. If the voltage level VPP exceeds the limit voltage VLIM at which the resistive memory cell begins to be turned on, the turned-on resistive memory cell may be programmed again, and thus the threshold voltage of the resistive memory cell may be lowered to the initial state programmed by the program pulse PWR.

In some example embodiments, voltage levels of the plurality of post pulses may be set to be lower than the lower limit of the threshold voltage distribution of the reset state. The resistance drift may be accelerated and the drift time may be shortened by applying the post pulse while maintaining the voltage level below the lower limit of the threshold voltage distribution, and by increasing the voltage level of the post pulse sequentially according as the threshold voltage of the resistive memory cell is increased. In some example embodiments and as illustrated in FIG. 15, each pulse VPP below the limit voltage VLIM may increase the lower threshold voltage VTHrl, and a sequence of pulses VPP of increasing voltage levels, maintained below the voltage limit VLIM, may accelerate the resistance drift and therefore the completion of programming the resistive memory cell MC.

FIGS. 16 through 20 are diagrams illustrating some example embodiments of a plurality of post pulses applicable to a programming method using a resistive memory device MC.

Figure 16:
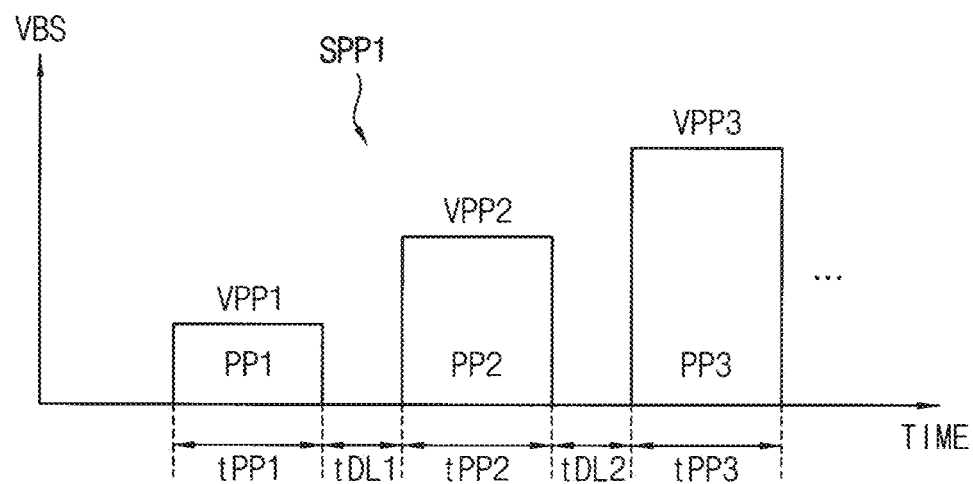
FIGS. 16 through 20 are diagrams illustrating example embodiments of a plurality of post pulses applicable to a programming method using a resistive memory device according to some example embodiments.

Referring to FIG. 16, a post pulse signal SPP1 that may accelerate the resistance drift may include a plurality of post pulses PP1, PP2 and PP3 having voltage levels VPP1, VPP2 and VPP3 and pulse widths tPP1, tPP2 and tPP3. The voltage levels VPP1, VPP2 and VPP3 of the plurality of post pulses PP1, PP2 and PP3 are increased sequentially. In some example embodiments, as illustrated in FIG. 16, the plurality of post pulses PP1, PP2 and PP3 may be applied to the resistive memory cell MC with time intervals tDL1 and tDL2, where the time intervals tDL1 and tDL2 may be the same or different. In some example embodiments, as illustrated in FIG. 2, the plurality of post pulses PP1, PP2 and PP3 may be applied to the resistive memory cell MC continuously without the time intervals tDL1 and tDL2.

Figure 17:
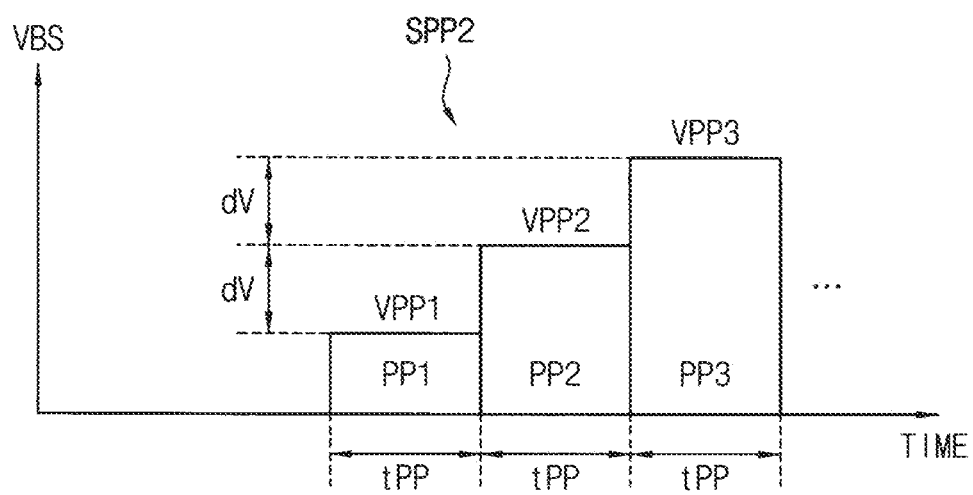

Referring to FIG. 17, a post pulse signal SPP2 that may accelerate the resistance drift may include a plurality of post pulses PP1, PP2 and PP3 having voltage levels VPP1, VPP2 and VPP3 and pulse widths tPP. In some example embodiments, as illustrated in FIG. 17, voltage levels VPP1, VPP2 and VPP3 of the plurality of post pulses PP1, PP2 and PP3 may increase sequentially. In some example embodiments, as illustrated in FIG. 17, the plurality of post pulses PP1, PP2 and PP3 may be applied to the resistive memory cell by a consistent voltage difference dV between sequentially adjacent post pulses; that is, the same voltage difference dV may be applied between voltage levels VPP1 and VPP2 as between voltage levels VPP2 and VPP3. In some other example embodiments (such as in FIG. 18), voltage differences dV between adjacent pulses may vary with respect to voltage differences dV between other adjacent pulses of the pulse sequence. Alternatively or additionally, in some example embodiments, pulse widths tPP of at least some of the plurality of post pulses PP1, PP2 and PP3 may be maintained to be equal. In some other example embodiments, pulse widths tPP of at least some of the post pulses PP1, PP2, PP3 may vary with respect to other post pulses.

Figure 18:
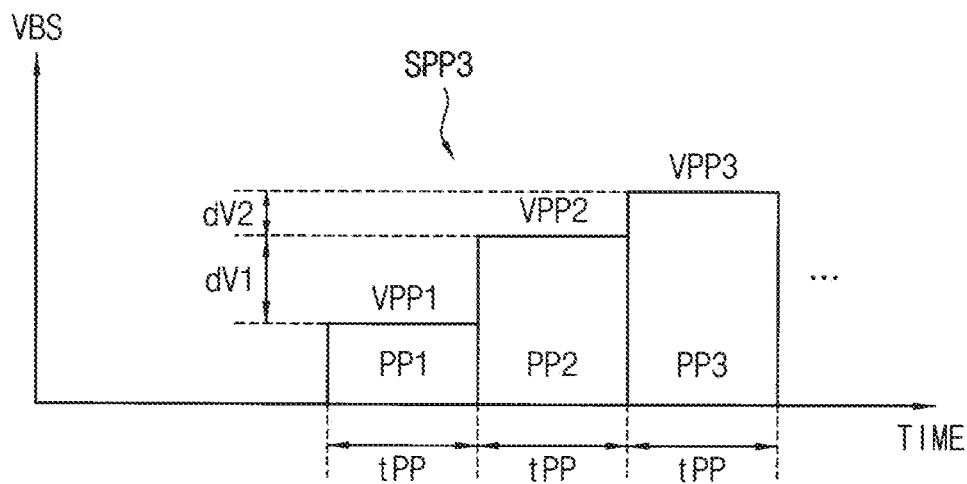

Referring to FIG. 18, a post pulse signal SPP3 that may accelerate the resistance drift may include a plurality of post pulses PP1, PP2 and PP3 having voltage levels VPP1, VPP2 and VPP3 and pulse widths tPP. In some example embodiments, as illustrated in FIG. 18, voltage levels VPP1, VPP2 and VPP3 of the plurality of post pulses PP1, PP2 and PP3 may increase sequentially. In some example embodiments, as illustrated in FIG. 18, the plurality of post pulses PP1, PP2 and PP3 may be applied to the resistive memory cell by sequentially decreasing voltage differences dV1 and dV2 between the voltage levels VPP1, VPP2 and VPP3. In other words, the magnitude of the voltage difference dV2 between the voltage level VPP3 of the third post pulse PP3 and the voltage level VPP2 of the second post pulse PP2 may be smaller than the magnitude of the voltage difference dV1 between the voltage level VPP2 of the second post pulse PP2 and the voltage level VPP1 of the first post pulse PP1. In the sequence of increasing voltage levels of the post pulses, the voltage level of the post pulse may gradually approach the lower limit of the threshold voltage VLIM, such as illustrated in FIG. 15. Thus, the resistance drift may be accelerated and also controlled finely by decreasing the voltage differences dV1 and dV2 sequentially. In some example embodiments, the pulse widths tPP of the plurality of post pulses PP1, PP2 and PP3 may be maintained to be equal; in other example embodiments, the pulse widths tPP of one or more of post pulses PP1, PP2, and PP3 may vary with respect to other post pulses.

Figure 19:
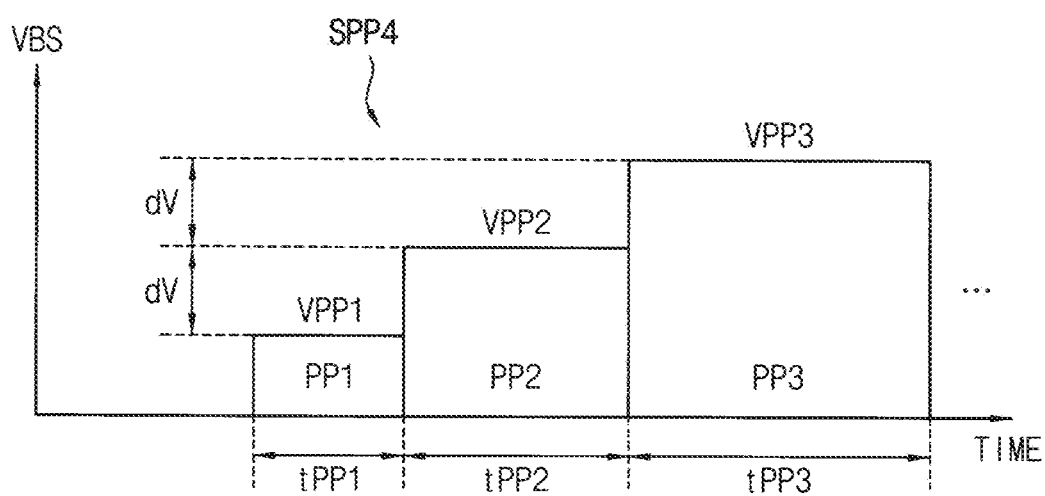

Referring to FIG. 19, a post pulse signal SPP4 that may accelerate a resistance drift may include a plurality of post pulses PP1, PP2 and PP3 having voltage levels VPP1, VPP2 and VPP3 and pulse widths tPP1, tPP2 and tPP3. In some example embodiments, the voltage levels VPP1, VPP2 and VPP3 of the plurality of post pulses PP1, PP2 and PP3 may sequentially vary, an/or the pulse widths tPP1, tPP2, tPP3 of the plurality of post pulses PP1, PP2, PP3 may sequentially vary. In some example embodiments, as illustrated in FIG. 19, the pulse widths tPP1, tPP2 and tPP3 of the plurality of post pulses PP1, PP2 and PP3 may sequentially increase. In other words, the pulse width tPP2 of the second post pulse PP2 may be longer than the pulse width tPP1 of the first post pulse PP1, and the pulse width tPP3 of the third post pulse PP3 may be longer than the pulse width tPP2 of the second post pulse PP2. The voltage levels VPP1, VPP2 and VPP3 of the plurality of post pulses PP1, PP2 and PP3 may be increased with the same voltage difference dV.

Figure 20:
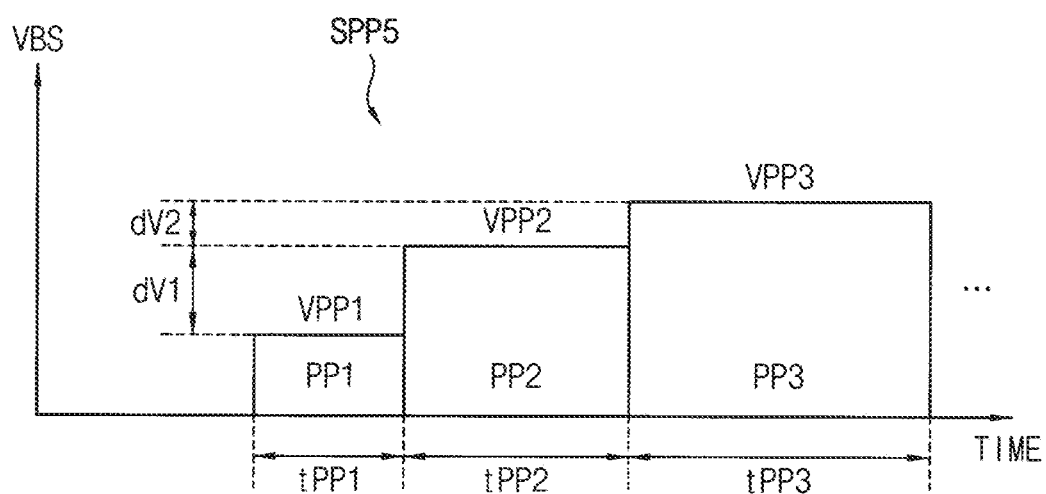
Figure 21:
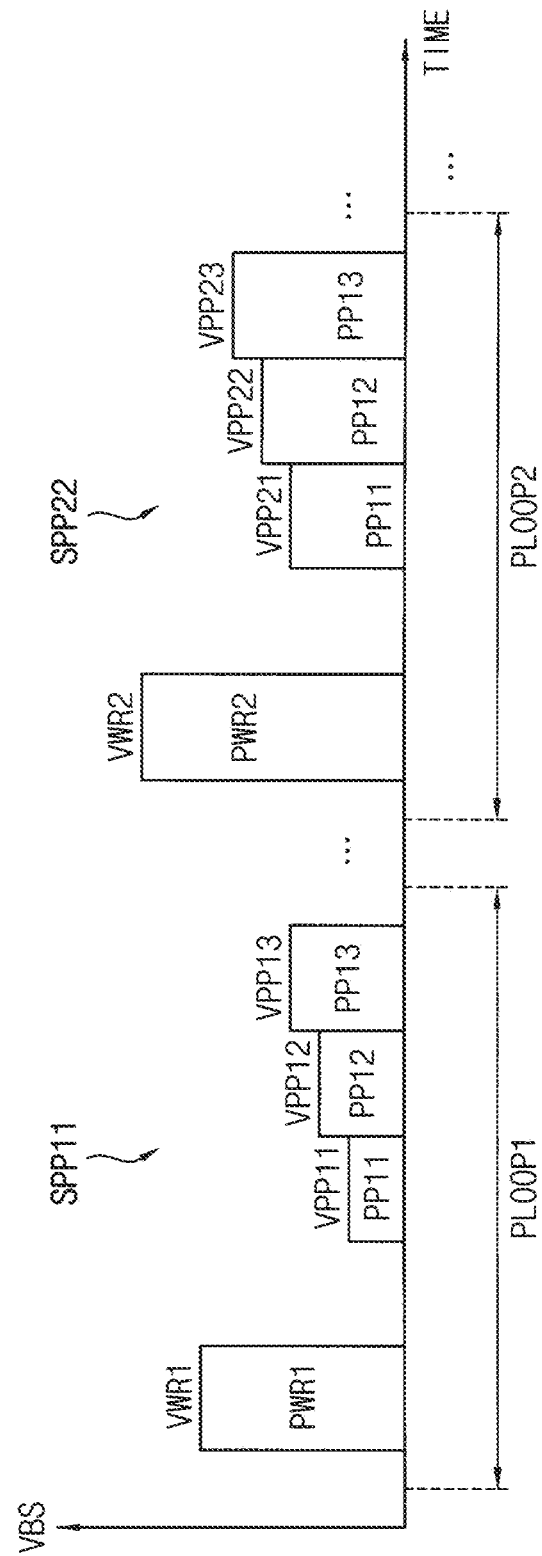
FIG. 21 is a diagram illustrating an incremental step pulse programming (ISPP) method of a resistive memory device according to some example embodiments.

Referring to FIG. 20, a post pulse signal SPP5 that may accelerate a resistance drift may include a plurality of post pulses PP1, PP2 and PP3 having voltage levels VPP1, VPP2 and VPP3 and pulse widths tPP1, tPP2 and tPP3. The voltage levels VPP1, VPP2 and VPP3 of the plurality of post pulses PP1, PP2 and PP3 are increased sequentially. In some example embodiments, as illustrated in FIG. 20, the plurality of post pulses PP1, PP2 and PP3 may be applied to the resistive memory cell by sequentially decreasing voltage differences dV1 and dV2 between the voltage levels VPP1, VPP2 and VPP3. In addition, FIG. 21 is a diagram illustrating an incremental step pulse programming (ISPP) method of a resistive memory device according to some example embodiments. Referring to FIG. 21, programming of resistive memory cells may be performed in the ISPP scheme such that a program voltage level of a program pulse may increase sequentially. According to the ISPP scheme, a programming operation may include a plurality of program loops, the program loops may be performed sequentially one by one until the programming operation is completed successfully. In some example embodiments, as FIG. 21 illustrates only a first program loop PLOOP1 and a second program loop PLOOP2 for convenience of illustration; in other example embodiments, the ISPP scheme may include three or more program loops.

In some example embodiments, with respect to at least some of a plurality of program loops, a voltage level of the program pulse may increase as the program loop is repeated. That is, applying the program pulse may include applying program pulses of program loops of a plurality of program loops with a higher voltage level than corresponding program pulses of preceding program loops of the plurality of program loops, and applying the plurality of post pulses may include applying post pulses of subsequent program loops of the plurality of program loops with a higher voltage level than corresponding post pulses in preceding program loops of the plurality of program loops. For example, as illustrated in FIG. 21, a voltage level VWR2 of a second program pulse PWR2 in the second program loop PLOOP2 may be increased to be higher than a voltage level VWR1 of a first program pulse PWR1 in the first program loop PLOOP1.

In some example embodiments, with respect to at least some of the plurality of program loops, a post pulse signal including a plurality of post pulses may be applied to the resistive memory cell to accelerate the resistance drift as described above. For example, as illustrated in FIG. 21, a first post pulse signal SPP11 may include a plurality of post pulses PP11, PP12 and PP13, and a second post pulse signal SPP22 may include a plurality of post pulses PP11, PP12 and PP13.

In an ISPP method according to some example embodiments, with respect to the plurality of program loops, the voltage levels of the plurality of post pulses may be increased as the program loop is repeated. In some example embodiments, as illustrated in FIG. 21, voltage levels VPP21, VPP22 and VPP23 of the plurality of post pulses PP11, PP12 and PP13 of the second program loop PLOOP2 may increase above voltage levels VPP11, VPP12 and VPP13 of the plurality of post pulses PP11, PP12 and PP13 of the first program loop PLOOP1.

Figure 22:
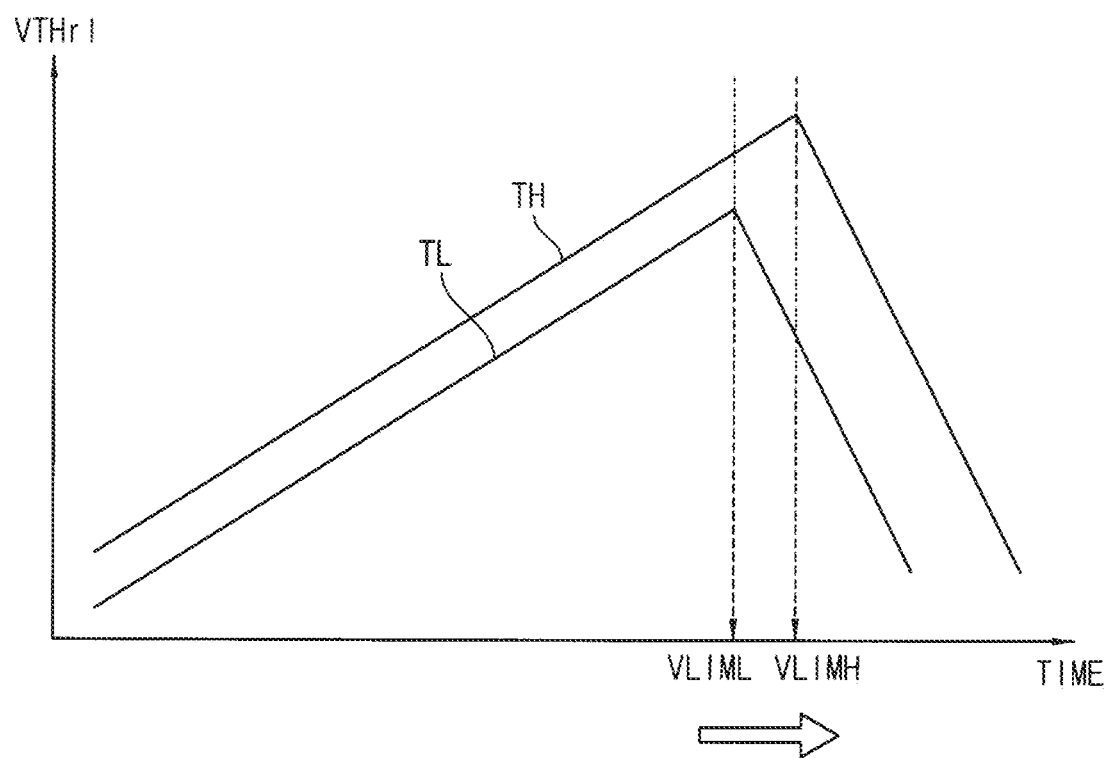
FIGS. 22 and 23 are diagrams a programming method of a resistive memory device based on an operation temperature according to some example embodiments.
Figure 23:
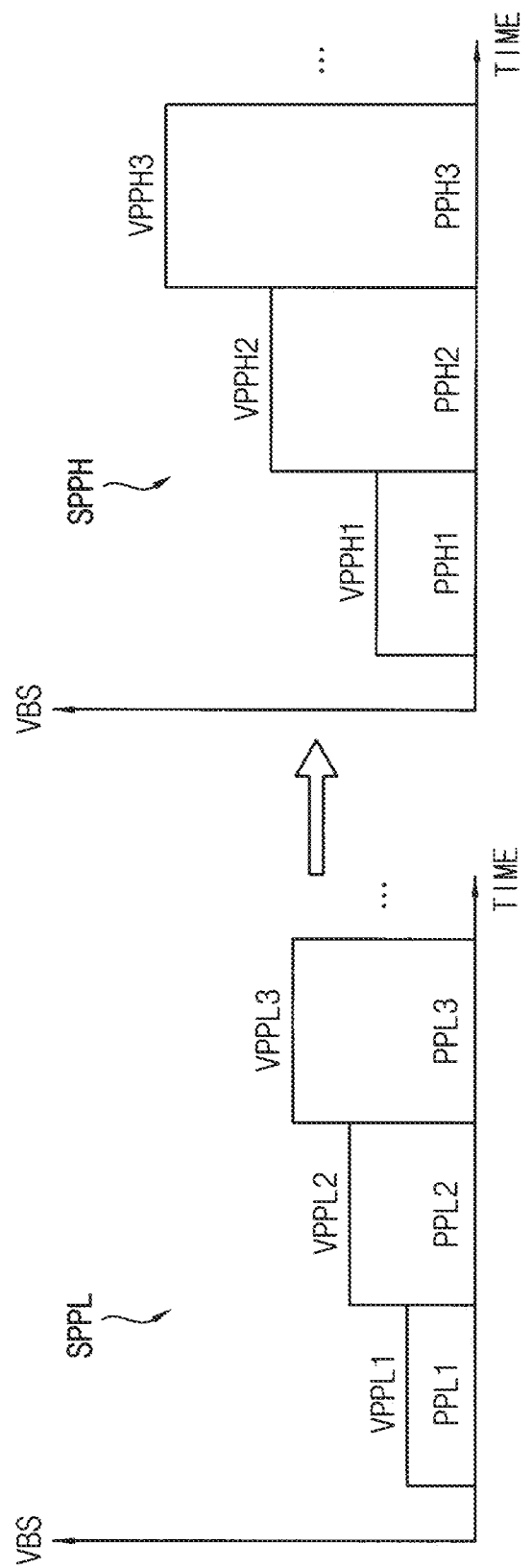

FIGS. 22 and 23 are diagrams a programming method of a resistive memory device based on an operation temperature according to some example embodiments.

FIG. 22 illustrates an example of a relationship between a voltage level VPP of a post pulse PP and a lower limit VTHrl of a reset threshold voltage of a reset state, which are measured at a measuring time point Tms in FIG. 14.

As described with reference to FIGS. 14 and 15, the lower limit VTHrl of the reset threshold voltage increases with the voltage level VPP of the post pulse PP, but the lower limit VTHrl decreases when the voltage level VPP of the post pulse PP exceeds a limit voltage VLIM. The resistance drift may be further accelerated as the voltage level VPP of the post pulse PP is increased. However, if the voltage level VPP exceeds the limit voltage VLIM at which the resistive memory cell begins to be turned on, the turned-on resistive memory cell may be programmed again and thus the threshold voltage of the resistive memory cell may be lowered to the initial state programmed by the program pulse PWR. As a result, a limit voltage VLIMH corresponding to a higher temperature TH may be higher than a limit voltage VLIML corresponding to a lower temperature TL.

Based on such dependency of the limit voltage on the operation temperature, in some example embodiments, the plurality of post pulses that may accelerate the resistance drift according to some example embodiments may be controlled as illustrated in FIG. 23.

FIG. 23 illustrates an example including a first post pulse signal SPPL corresponding to a lower temperature TL and a second post pulse signal SPPH corresponding to a higher temperature TH. The first post pulse signal SPPL may include a plurality of post pulses PPL1, PPL2 and PPL3 having sequentially increasing voltage levels VPPL1, VPPL2 and VPPL3, and the second post pulse signal SPPH may include a plurality of post pulses PPH1, PPH2 and PPH3 having sequentially increasing voltage levels VPPH1, VPPH2 and VPPH3. In some example embodiments, as illustrated in FIG. 23, voltage levels of the plurality of post pulses may be increased as an operation temperature of the resistive memory device increases. In other words, the voltage levels VPPH1, VPPH2 and VPPH3 of the plurality of post pulses PPH1, PPH2 and PPH3 included in the second post pulse signal SPPH corresponding the higher temperature may be increased to be higher than the voltage levels VPPL1, VPPL2 and VPPL3 of the plurality of post pulses PPL1, PPL2 and PPL3 included in the first post pulse signal SPPL corresponding the lower temperature.

Figure 24:
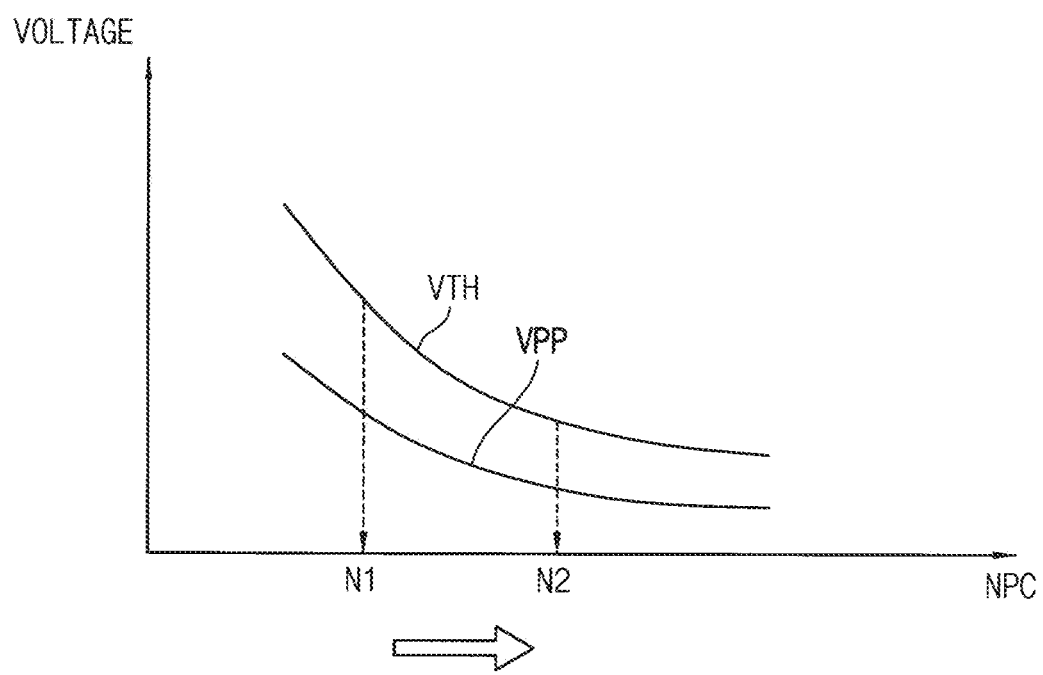
FIGS. 24 and 25 are diagrams a programming method of a resistive memory device based on a program cycle number according to some example embodiments.
Figure 25:
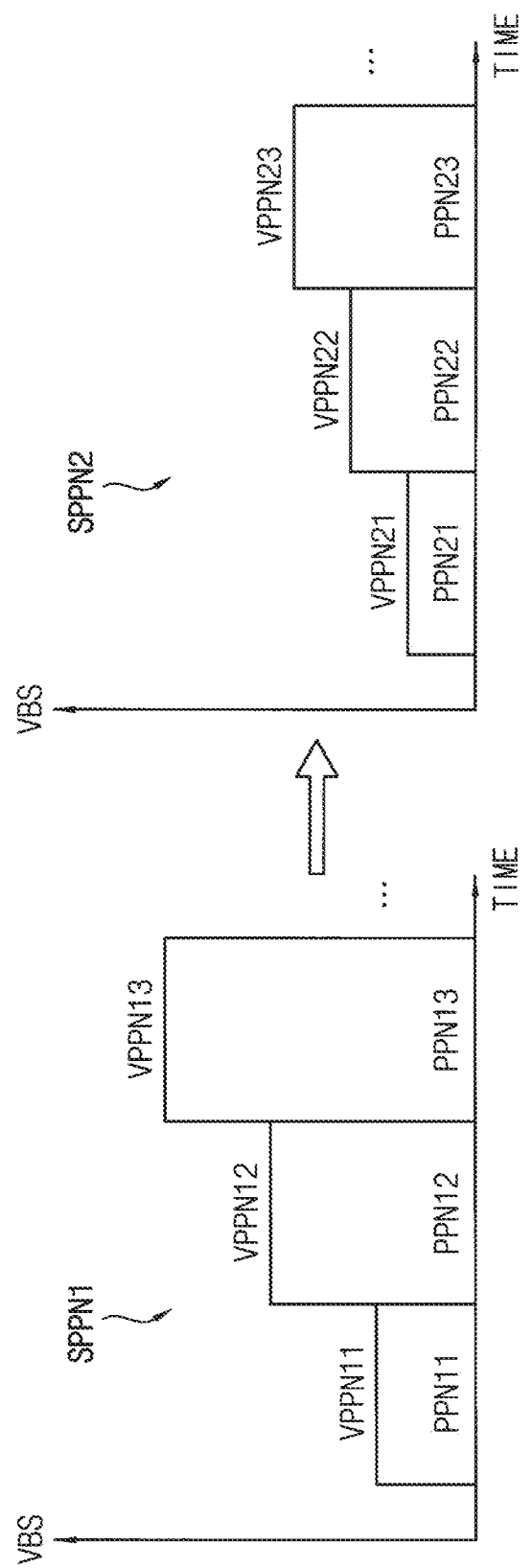

FIGS. 24 and 25 are diagrams illustrating a programming method of a resistive memory device based on a program cycle number according to some example embodiments.

FIG. 24 illustrates an example in which changes of a threshold voltage VTH and a voltage level VPP of a post pulse are based on a program cycle number NPC. As illustrated in FIG. 24, a resistive memory cell MC may degenerate as the program cycles are repeated, which may cause the threshold voltage to decrease gradually. For example, in case of Ge—Sb—Te 3-element chalcogenide material (GST), the threshold voltage of the resistive memory cell MC including GST may decrease as the program cycles are repeated due to migration of particular elements.

In some example embodiments, in view of such a relationship of threshold voltage VTH and the program cycle number NPC, a plurality of post pulses that may be applied to accelerate the resistance drift may be controlled such as illustrated in FIGS. 24 and 25.

FIG. 25 illustrates an example in which first post pulse signal SPPN1 corresponding to a smaller program cycle number N1 and a second post pulse signal SPPN2 corresponding to a greater program cycle number N2. The first post pulse signal SPPN1 may include a plurality of post pulses PPN11, PPN12 and PPN13 having sequentially increasing voltage levels VPPN11, VPPN12 and VPPN13, and the second post pulse signal SPPN2 may include a plurality of post pulses PPN21, PPN22 and PPN23 having sequentially increasing voltage levels VPPN21, VPPN22 and VPPN23. In some example embodiments, as illustrated in FIG. 25, the voltage levels of the plurality of post pulses may decrease as the program cycle number NPC increases. In other words, the voltage levels VPPN21, VPPN22 and VPPN23 of the plurality of post pulses PPN21, PPN22 and PPN23 included in the second post pulse signal SPPN2 corresponding the greater program cycle number N2 may decrease to be lower than the voltage levels VPPN11, VPPN22 and VPPN23 of the plurality of post pulses PPN11, PPN12 and PPN13 included in the first post pulse signal SPPN1 corresponding the smaller program cycle number N1.

Figure 26:
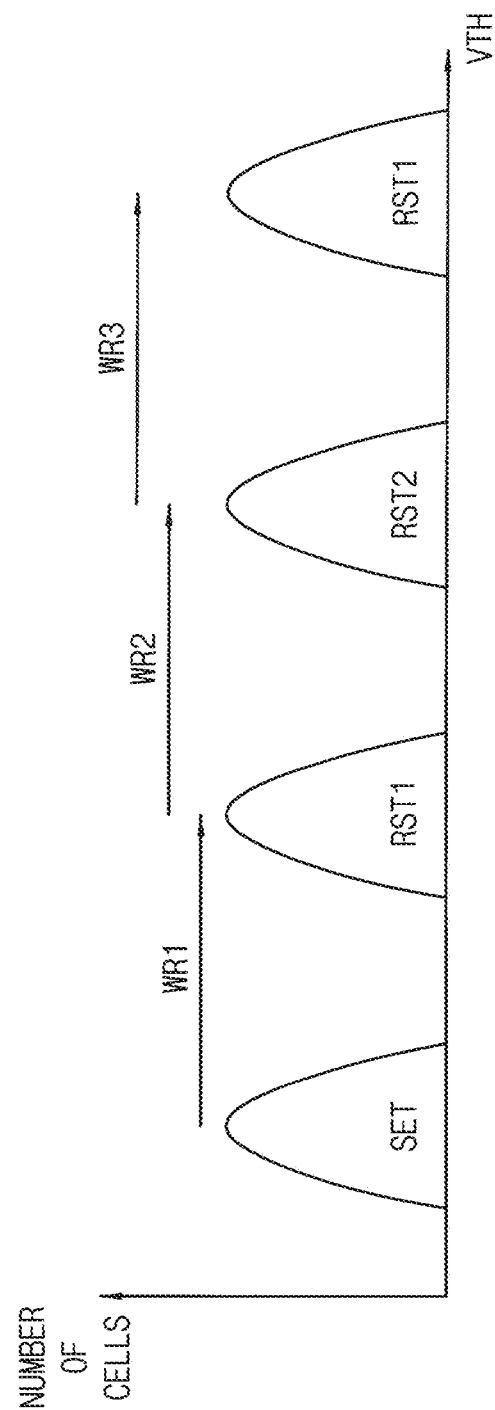
FIGS. 26 and 27 are diagrams a programming method of a multi-level cell of a resistive memory device according to some example embodiments.
Figure 27:
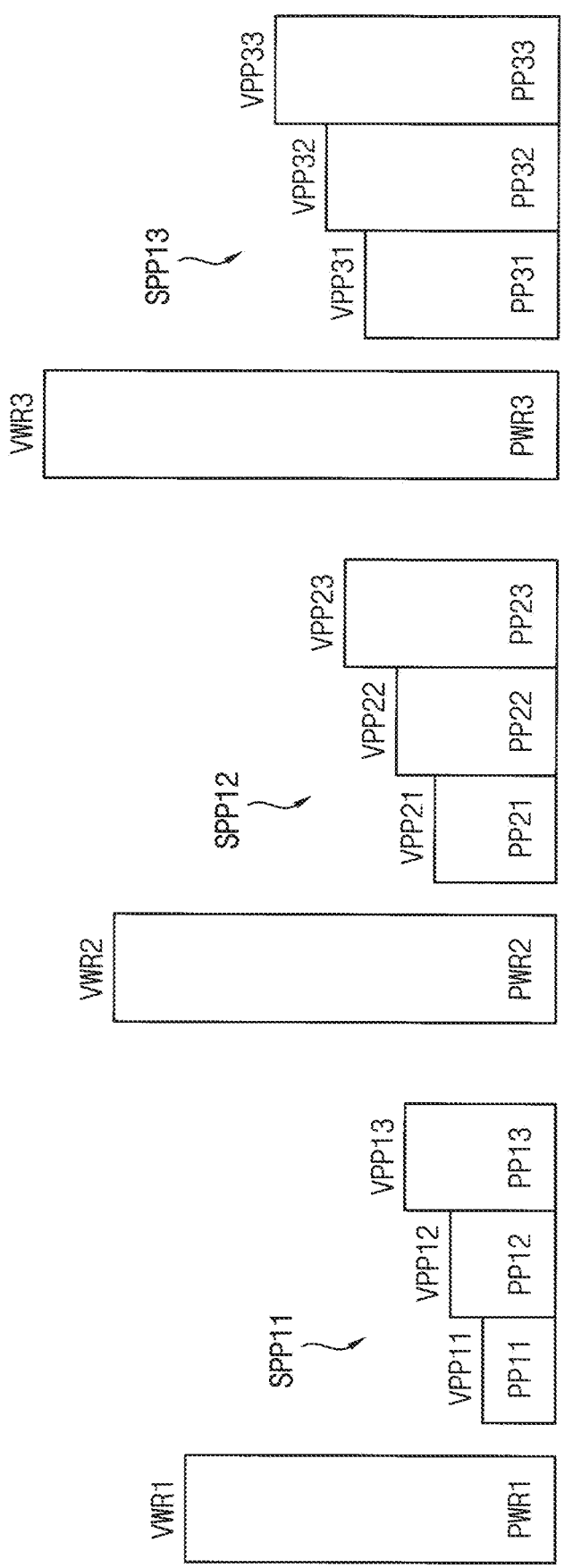

FIGS. 26 and 27 are diagrams a programming method of a multi-level cell of a resistive memory device according to some example embodiments.

FIG. 26 illustrates, as a non-limiting example, four states of resistive memory cells when two bits are stored in each resistive memory cell. As illustrated in FIG. 26, the four states may include a set state SET, a first reset state RST1, a second reset state RST2 and a third reset state RST3. The resistive memory cells may be programmed to the first reset state RST1, the second reset state RST2 and the third reset state RST3 through a first program operation WR1, a second program operation WR2 and a third program operation WR3, respectively. For example, the second program operation WR2 may be programming the resistive memory cell from the set state SET to the second reset state RST2 or from the first reset state RST1 to the second reset state RST2.

As illustrated in an example in FIG. 27, a first program pulse PWR1 having a first program voltage level VWR1 may be applied to a first resistive memory cell to program a first reset state RST1 of the first resistive memory cell, a second program pulse PWR2 having a second program voltage level VWR2 higher than the first program voltage level VWR1 to a second resistive memory cell to program a second reset state RES2 of the second resistive memory cell, and a third program pulse PWR3 having a third program voltage level VWR3 higher than the second program voltage level VWR2 to a third resistive memory cell to program a third reset state RES3 of the third resistive memory cell, where the second reset state RST2 has a higher resistance distribution than the first reset state RST1, and the third reset state RST3 has a higher resistance distribution than the second reset state RST2.

In some example embodiments, in case of programming a multi-level cell, the voltage level of the plurality of post pulses may be increased as the reset state having the higher resistance distribution is programmed. In other words, as illustrated in FIG. 27, a first post pulse signal SPP1 including a plurality of first post pulses PP11, PP12 and PP13 having sequentially increasing first voltage levels VPP11, VPP12 and VPP13 may be applied to the first resistive memory cell after applying the first program pulse PWR1, a second post pulse signal SPP2 including a plurality of second post pulses PP21, PP22 and PP23 having sequentially increasing second voltage levels VPP21, VPP22 and VPP23 higher than the first voltage levels VPP11, VPP12 and VPP13 may be applied to the second resistive memory cell after applying the second program pulse PWR2, and a third post pulse signal SPP3 including a plurality of third post pulses PP31, PP32 and PP33 having sequentially increasing second voltage levels VPP31, VPP32 and VPP33 higher than the second voltage levels VPP21, VPP22 and VPP23 may be applied to the second resistive memory cell after applying the second program pulse PWR2.

Figure 28:
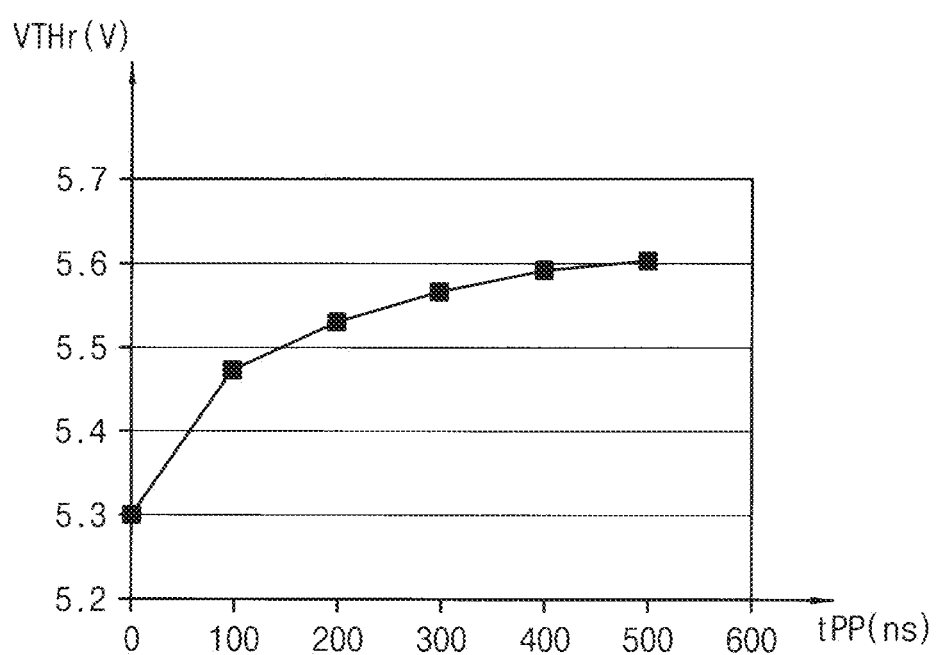
FIG. 28 is a diagram illustrating a relation between a pulse width of a post pulse applied to a resistive memory cell and a threshold voltage of the resistive memory cell.

FIG. 28 is a diagram illustrating an example of a relationship between a pulse width tPP of a post pulse applied to a resistive memory cell and a threshold voltage of the resistive memory cell, wherein the post pulses are illustrated in units of nanosecond (ns) and a threshold voltage VTHr of a resistive memory cell in a reset state is illustrated in units of volt (V). In some example embodiments, as illustrated in FIG. 28, as a pulse width tPP increases, an increase of the acceleration degree may be reduced and thus the threshold voltage VTHr is saturated at a particular voltage level. In the example of FIG. 28, the threshold voltage VTHr approaches about 5.6V when the pulse width tPP of the post pulse is about 500 ns. In this case, it may be sufficient to set the pulse width tPP to less than or equal to about 500 ns.

In program methods according to some example embodiments, a relaxation time tRX at which the plurality of post pulses to accelerate the resistance drift may be determined based on the saturation characteristic that are associated with a cooling time for which the resistive memory cell is cooled to the reset state after the program pulse is applied.

Figure 29:
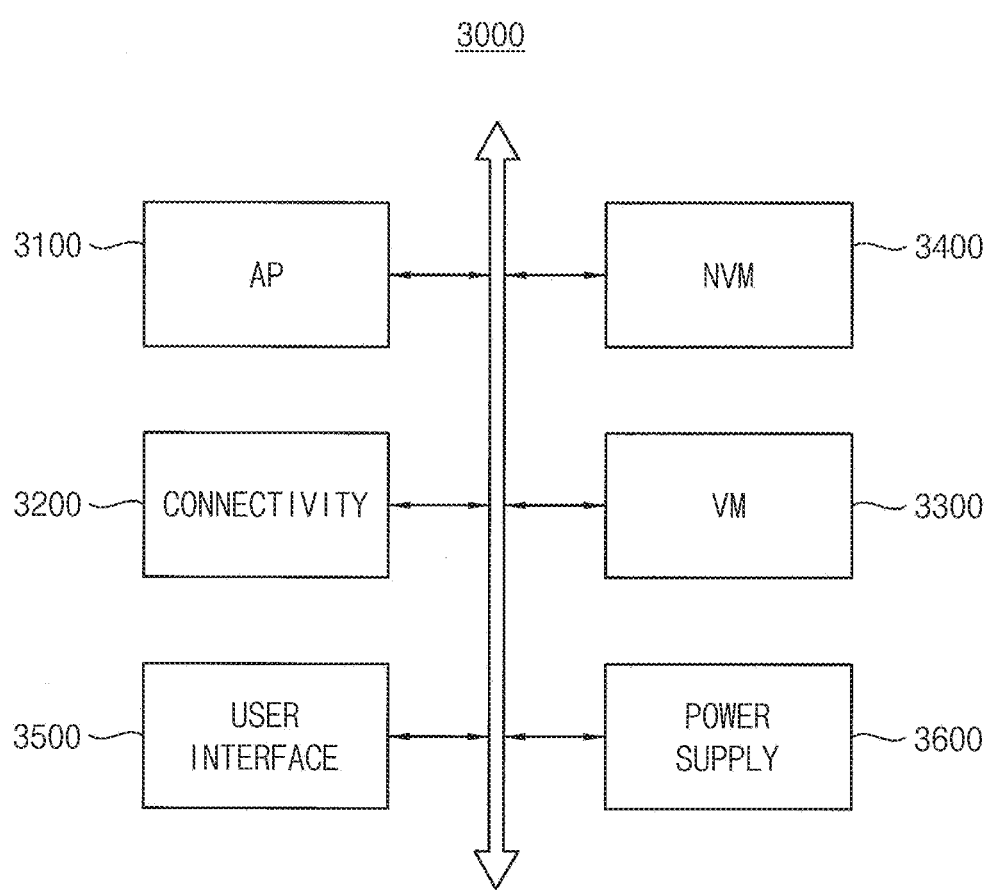
FIG. 29 is a block diagram illustrating a mobile system including a memory device according to some example embodiments.

FIG. 29 is a block diagram illustrating a mobile system including a memory device according to some example embodiments. In some example embodiments, as illustrated in FIG. 29, a mobile system 3000 may include an application processing circuitry AP 3100, a connectivity unit 3200, a volatile memory device VM 3300, a nonvolatile memory device NVM 3400, a user interface 3500, and a power supply 3600 connected via a bus. The application processing circuitry 3100 may include hardware such as logic circuits; a hardware/software combination, such as a processor executing software; or a combination thereof. For example, a processor may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The application processing circuitry 3100 may be configured to execute applications such as a web browser, a game application, a video player, and the like. The connectivity unit 3200 may be configured to perform wired or wireless communication with an external device.

The volatile memory device 3300 may be configured to store data processed by the application processor 3100, or may operate as a working memory. For example, the volatile memory device 3300 may be a DRAM, such as a double data rate synchronous dynamic random access memory (DDR SDRAM), low power DDR (LPDDR) SDRAM, graphics DDR (GDDR) SDRAM, Rambus DRAM (RDRAM), and the like.

The nonvolatile memory device 3400 may be configured to store a boot image for booting the mobile system 3000 and other data. The nonvolatile memory device 3400 may be a phase change random access memory (PRAM) using a phase change materials, a resistance random access memory (RRAM) using a variable resistance material such as complex metal oxide, a magneto-resistive random access memory (MRAM) using a magnetic material.

The user interface 3500 may include at least one input device, such as a keypad, a touch screen, and the like, and/or at least one output device, such as a speaker, a display device, and the like. The power supply 3600 may supply a power supply voltage to the mobile system 3000. In example embodiment of the inventive concepts, the mobile system 3000 may further include a camera image processor (CIS), and/or a storage device, such as a memory card, a solid state drive (SSD), a hard disk drive (HDD), a compact disc read only memory (CD-ROM), and the like.

The nonvolatile memory device 3400 may be configured to apply a plurality of post pulses to a resistive memory cell MC to accelerate the resistance drift as described with reference to FIGS. 1 through 28.

As described above, the resistive memory device and the programming method according to example embodiments may enhance a programming speed and performance of the resistive memory device by accelerating resistance drift of the resistive memory cell using the plurality of post pulses having the voltage levels that increase sequentially.

As described herein, some example embodiments refer to voltages, such as a voltage that may be applied over a resistive memory cell MC and/or that may be detected over a resistive memory cell MC. It is to be appreciated that some example embodiments may instead control current through a resistive memory cell MC instead of controlling voltage, and/or may detect current through a memory cell MC instead of detecting voltage, without departing from the scope of the present disclosure. For example, rather than determining a set or reset state of a resistive memory cell MC based on a detected voltage level and a threshold voltage level, some example embodiments may determine the set or reset state of a resistive memory cell MC based on a detected current level and a threshold current level. In some example embodiments, voltage and/or current may be controlled by controlling the voltage directly applied to the memory cell MC and/or the current through the memory cell MC. In some other example embodiments, voltage and/or current may be controlled by controlling the voltage and/or current of another portion of the circuit including the MC, such as a bitline or wordline, where such controlling affects, and therefore indirectly controls, the voltage and/or current of the memory cell MC. Similarly, in some example embodiments, voltage over the memory cell MC and/or current through the memory cell MC may be determined by directly measuring voltage and/or current of the memory cell MC. In some other example embodiments, voltage and/or current may be measured by measuring voltage and/or current of another portion of a circuit including the memory cell MC, such as a bitline or wordline, where such measuring may enable an inference of the voltage and/or current of the memory cell MC. In some example embodiments, current may be determined based on voltage, such as transconductance or transadmittance, whereas in some other example embodiments, voltage may be determined based on current, such as transresistance or transimpedance. In various example embodiments, voltage and/or current may be determined based on a direct correlation or an inverse correlation. All such variations that are reasonably and logically possible, and that are not contradictory with other statements, are intended to be included in this disclosure, the scope of which is to be understood as being defined by the claims.

Some example embodiments of some inventive concepts may be applied to resistive memory devices and systems including the resistive memory devices. For example, some example embodiments may be applied to systems such as a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, and the like.

Some portions of the present disclosure, including descriptions of some example embodiments, may refer to a second event that may occur "in response to" a first event. In various instances, the term "in response to" may include, for example, the second event may occur after the first event, either promptly or after a delay; that the second event may occur concurrently with the first event; and/or that the second event occurring on condition of the first event. In various instances, the second event may occur only in response to the first event, while in other instances, the second event may also occur in the absence of the first event. All such variations that are reasonably and logically possible, and that are not contradictory with other statements, are intended to be included in this disclosure, the scope of which is to be understood as being defined by the claims. The present disclosure is illustrative of some example embodiments and is not to be construed as limiting thereof. Although some example embodiments have been described, those skilled in the art will readily appreciate that many modifications are possible in some example embodiments without materially departing from some inventive concepts.

What is claimed is:

1. A programming method of a resistive memory device, the method comprising:
    applying a program pulse to a resistive memory cell in a program cycle; and
    applying a plurality of post pulses to the resistive memory cell in the program cycle after a relaxation time from a time point at which application of the program pulse is finished, while maintaining voltage levels of the plurality of post pulses below a lower limit voltage, the plurality of post pulses having the voltage levels that increase sequentially, the lower limit voltage being a voltage at which the resistive memory cell begins to turn on.

2. The programming method of claim 1, wherein applying the plurality of post pulses includes increasing the voltage levels of the plurality of post pulses by maintaining voltage differences between the voltage levels.

3. The programming method of claim 1, wherein applying the plurality of post pulses includes maintaining pulse widths of the plurality of post pulses to be equal.

4. The programming method of claim 1, wherein applying the plurality of post pulses includes increasing the voltage levels of the plurality of post pulses by maintaining voltage differences between the voltage levels to be equal, and maintaining pulse widths of the plurality of post pulses to be equal.

5. The programming method of claim 1, wherein applying the plurality of post pulses includes sequentially increasing the voltage levels of the plurality of post pulses while sequentially decreasing incremental voltage differences between voltage levels of adjacent pairs of plurality of post pulses.

6. The programming method of claim 1, wherein applying the plurality of post pulses includes sequentially increasing pulse widths of the plurality of post pulses.

7. The programming method of claim 1, wherein applying the plurality of post pulses includes increasing the voltage levels of the plurality of post pulses by sequentially decreasing voltage differences between the voltage levels, and sequentially increasing pulse widths of the plurality of post pulses.

8. The programming method of claim 1, wherein applying the program pulse includes applying the program pulse of a subsequent one of a plurality of program loops with a higher voltage level than the program pulse of a preceding one of the plurality of program loops, and wherein applying the plurality of post pulses includes applying the post pulses of a subsequent one of the plurality of program loops with higher voltage levels than voltage levels of corresponding ones of the post pulses of a preceding one of the plurality of program loops.

9. The programming method of claim 1, wherein applying the plurality of post pulses includes increasing the voltage levels of the plurality of post pulses as an operation temperature of the resistive memory device increases.

10. The programming method of claim 1, wherein applying the plurality of post pulses includes sequentially increasing the voltage levels of the post pulses in a single program cycle, while decreasing first voltage levels of the post pulses of a subsequent one of a plurality of program cycles are lower than second voltage levels of corresponding ones of the post pulses of the preceding one of the plurality of program cycles.

11. The programming method of claim 1, wherein applying the program pulse includes applying a first program pulse having a first program voltage level to a first resistive memory cell to program a first reset state of the first resistive memory cell, and applying a second program pulse having a second program voltage level that is higher than the first program voltage level to a second resistive memory cell to program a second reset state of the second resistive memory cell, the second reset state having a higher resistance distribution than the first reset state, wherein applying the plurality of post pulses includes after applying the first program pulse, applying a plurality of first post pulses having first voltage levels to the first resistive memory cell, and after applying the second program pulse, applying a plurality of second post pulses having second voltage levels that are higher than the first voltage levels to the second resistive memory cell.

12. The programming method of claim 1, wherein the program pulse is a reset program pulse to program the resistive memory cell to a reset state.

13. The programming method of claim 12, wherein the voltage levels of the plurality of post pulses are lower than a lower limit of a threshold voltage distribution of the reset state.

14. The programming method of claim 1, wherein the plurality of post pulses are applied to the resistive memory cell only in response to the program pulse being a reset program pulse to program the resistive memory cell to a reset state, and the plurality of post pulses are not applied to the resistive memory cell in response to the program pulse being a set program pulse to program the resistive memory cell to a set state.

15. The programming method of claim 1, wherein the resistive memory cell includes a phase-change material, and the resistive memory device is a phase-change random access memory (PRAM).

16. The programming method of claim 1, wherein the program pulse is a set program pulse to program the resistive memory cell to a set state.

17. A programming method of a resistive memory device, the method comprising:

applying a reset program pulse to a resistive memory cell including a phase-change material in a program cycle;

applying a first post pulse having a first voltage level to the resistive memory cell in the program cycle, after a relaxation time from a time point at which application of the reset program pulse is finished, while maintaining the first voltage level of the first post pulse below a lower limit voltage, the lower limit voltage being a voltage at which the resistive memory cell begins to turn on; and applying a second post pulse having a second voltage level that is higher than the first voltage level and below the lower limit voltage to the resistive memory cell in the program cycle, after the first post pulse is applied.

18. The programming method of claim 17, wherein a first pulse width of the first post pulse is equal to or shorter than a second pulse width of the second post pulse.

19. The programming method of claim 17, further comprising:

applying a third post pulses having a third voltage level higher than the second voltage level and below the lower limit voltage to the resistive memory cell in the program cycle, after the second post pulse is applied, wherein a voltage difference between the third voltage level and the second voltage level is smaller than a voltage difference between the second voltage level and the first voltage level.

20. A resistive memory device comprising:

a memory cell array including a plurality of resistive memory cells in a program cycle; and a voltage generator configured to generate a program pulse and a plurality of post pulses having voltage levels that increase sequentially, wherein the resistive memory device is configured to, apply the program pulse to a selected resistive memory cell among the plurality of resistive memory cells in the program cycle, and apply the plurality of post pulses to the selected resistive memory cell in the program cycle, after a relaxation time from a time point at which application of the program pulse is finished, while maintaining the voltage levels of the plurality of post pulses below a lower limit voltage, the lower limit voltage being a voltage at which the selected resistive memory cell begins to turn on.

\* \* \* \* \*